United States Patent
Yokajty et al.

(10) Patent No.: US 7,279,063 B2
(45) Date of Patent: Oct. 9, 2007

(54) METHOD OF MAKING AN OLED DISPLAY DEVICE WITH ENHANCED OPTICAL AND MECHANICAL PROPERTIES

(75) Inventors: Joseph E. Yokajty, Webster, NY (US); Jeffrey P. Serbicki, Holley, NY (US); Steven A. Van Slyke, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 426 days.

(21) Appl. No.: 10/759,914

(22) Filed: Jan. 16, 2004

(65) Prior Publication Data
US 2005/0155704 A1    Jul. 21, 2005

(51) Int. Cl.
*B29C 65/54* (2006.01)

(52) U.S. Cl. ............... 156/275.5; 156/275.7; 156/295

(58) Field of Classification Search ........ 257/E51.022; 313/512; 156/275.5
See application file for complete search history.

(56) References Cited

U.S. PATENT DOCUMENTS

| | | | | |
|---|---|---|---|---|
| 4,657,341 | A * | 4/1987 | Sammueller ................ | 385/59 |
| 6,198,217 | B1 * | 3/2001 | Suzuki et al. ............... | 313/504 |
| 6,268,695 | B1 | 7/2001 | Affinito | |
| 6,867,539 | B1 * | 3/2005 | McCormick et al. ....... | 313/504 |
| 2002/0074931 | A1 * | 6/2002 | Liedenbaum ............... | 313/493 |
| 2002/0155320 | A1 | 10/2002 | Park et al. | |
| 2002/0187775 | A1 | 12/2002 | Corrigan et al. | |
| 2002/0193035 | A1 | 12/2002 | Wei et al. | |
| 2003/0067268 | A1 * | 4/2003 | Matsuoka .................... | 313/512 |
| 2003/0218422 | A1 * | 11/2003 | Park et al. .................. | 313/512 |
| 2003/0218442 | A1 * | 11/2003 | Park et al. .................. | 313/512 |
| 2005/0002081 | A1 * | 1/2005 | Beteille et al. ............. | 359/275 |

* cited by examiner

*Primary Examiner*—Richard Crispino
*Assistant Examiner*—Emily Chimiak
(74) *Attorney, Agent, or Firm*—Raymond L. Owens

(57) ABSTRACT

A method of bonding a cover plate over OLED devices formed on a surface of a device substrate wherein each one of the OLED devices includes at least one electrical interconnect area includes providing a flow-preventing pattern on a surface of the cover plate or on the OLED devices absent from the electrical interconnect areas of the OLED devices to prevent flow of a flowable adhesive material into at least the outermost portions of such interconnect areas; dispensing a selected amount of a flowable curable adhesive material on the surface of the cover plate in registration with the flow-preventing pattern; engaging the cover plate in alignment with the substrate; and curing the adhesive material.

16 Claims, 17 Drawing Sheets

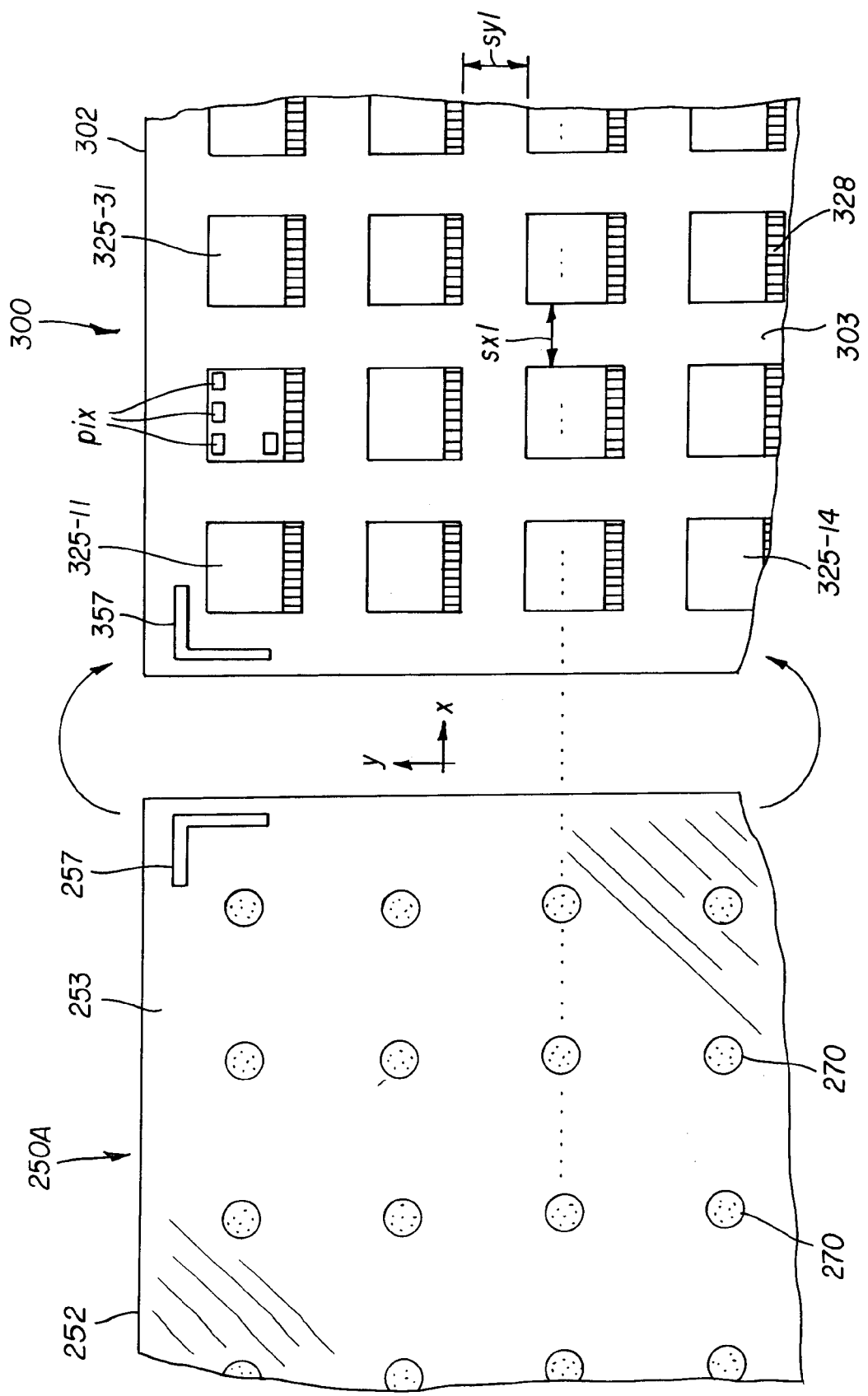

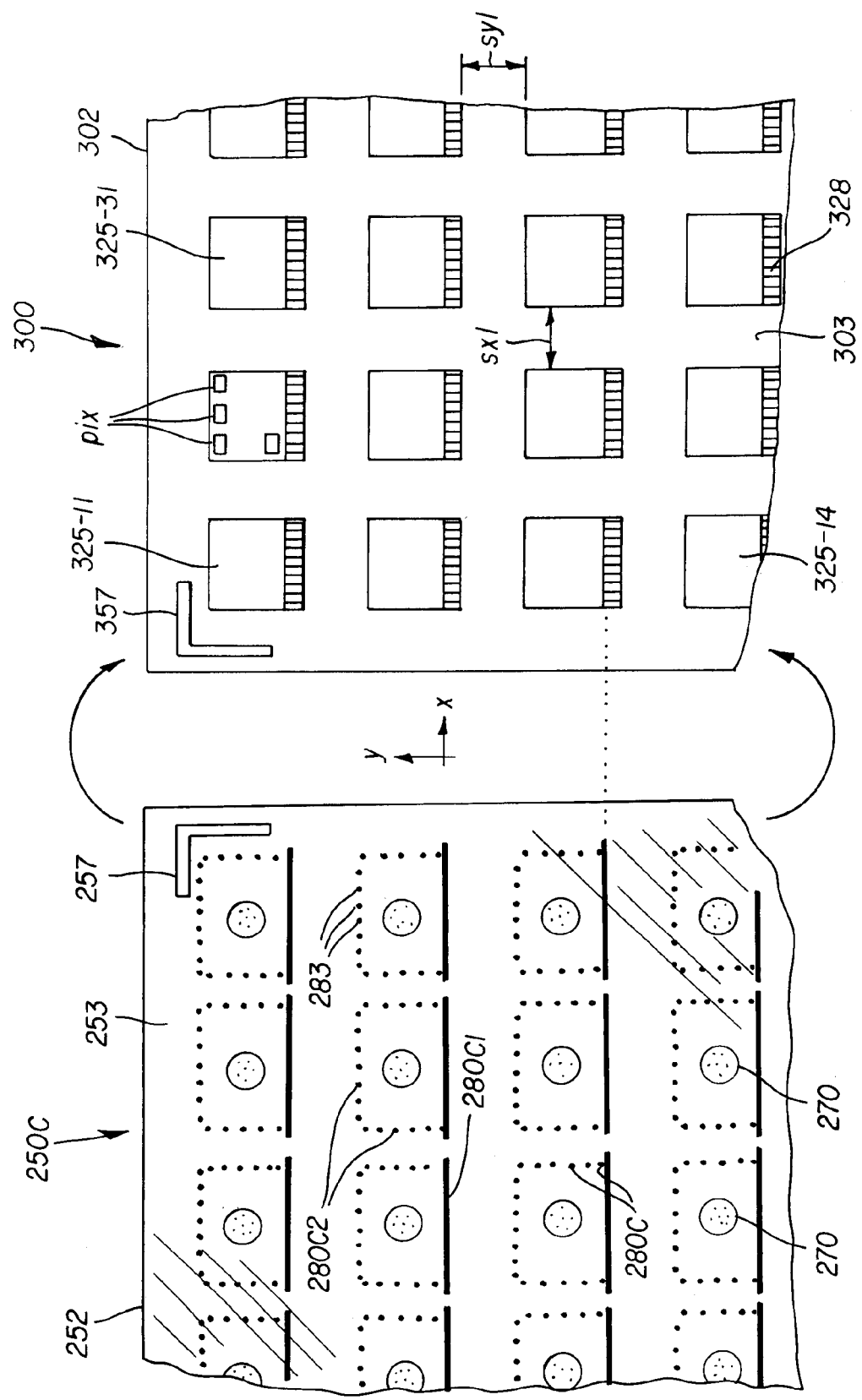

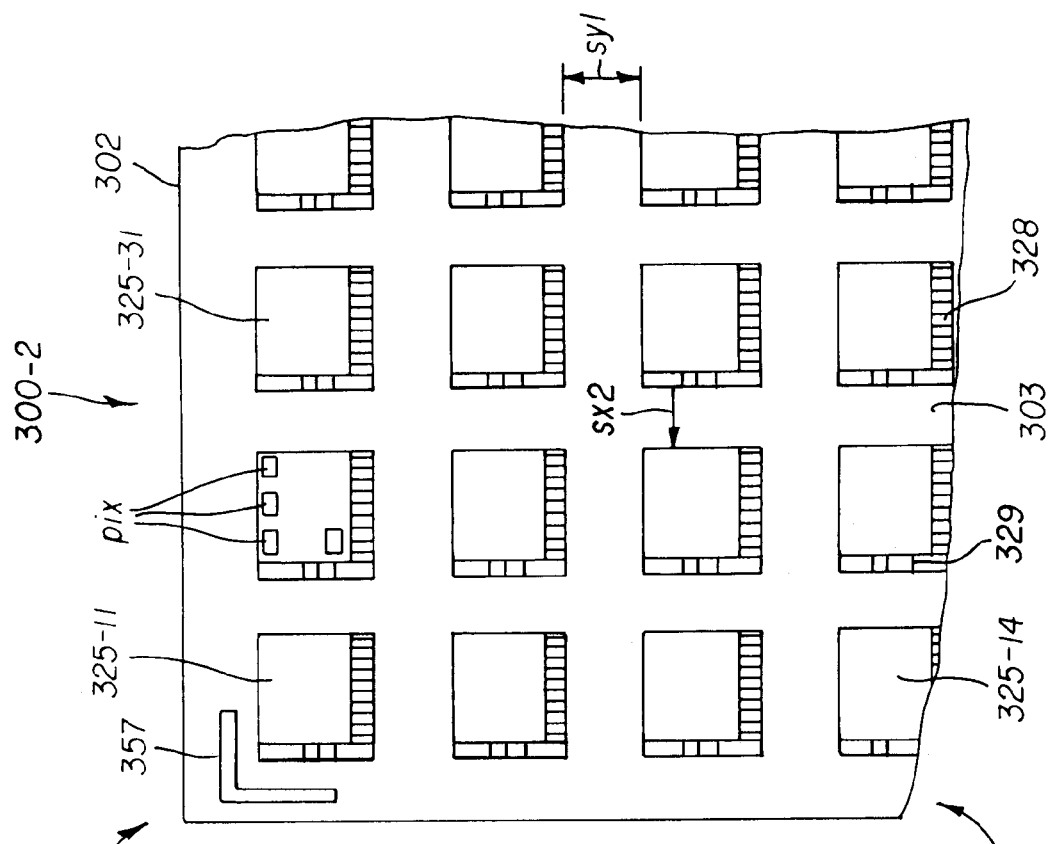
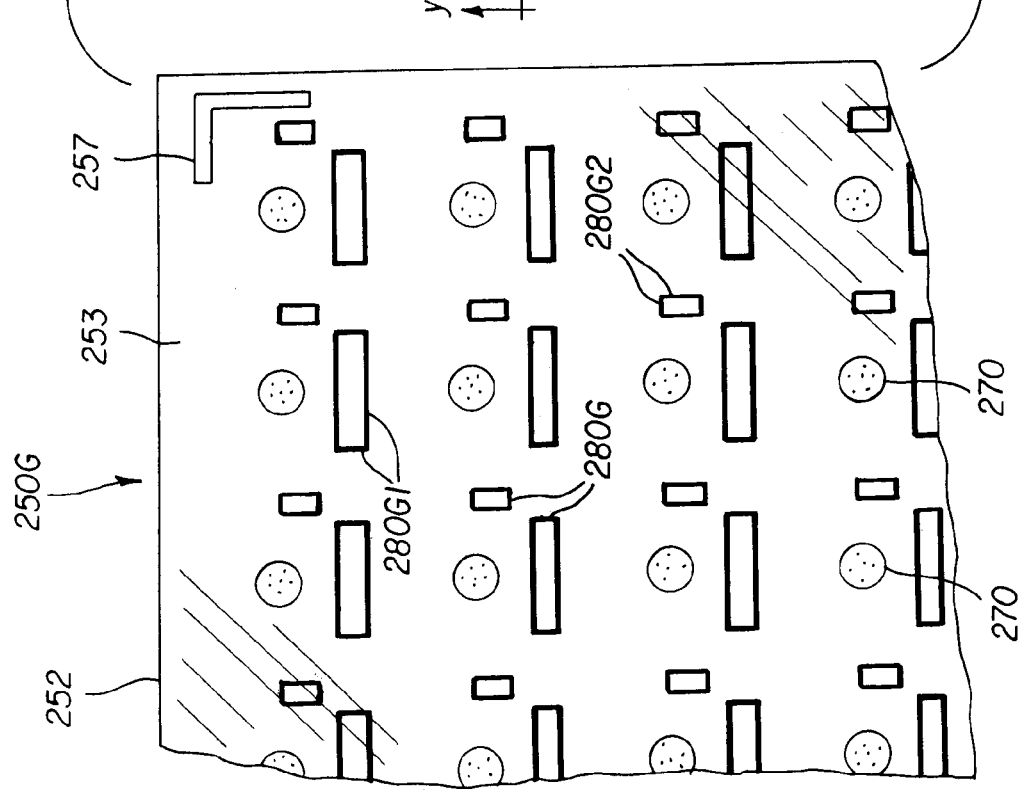
FIG. 9B
FIG. 9A

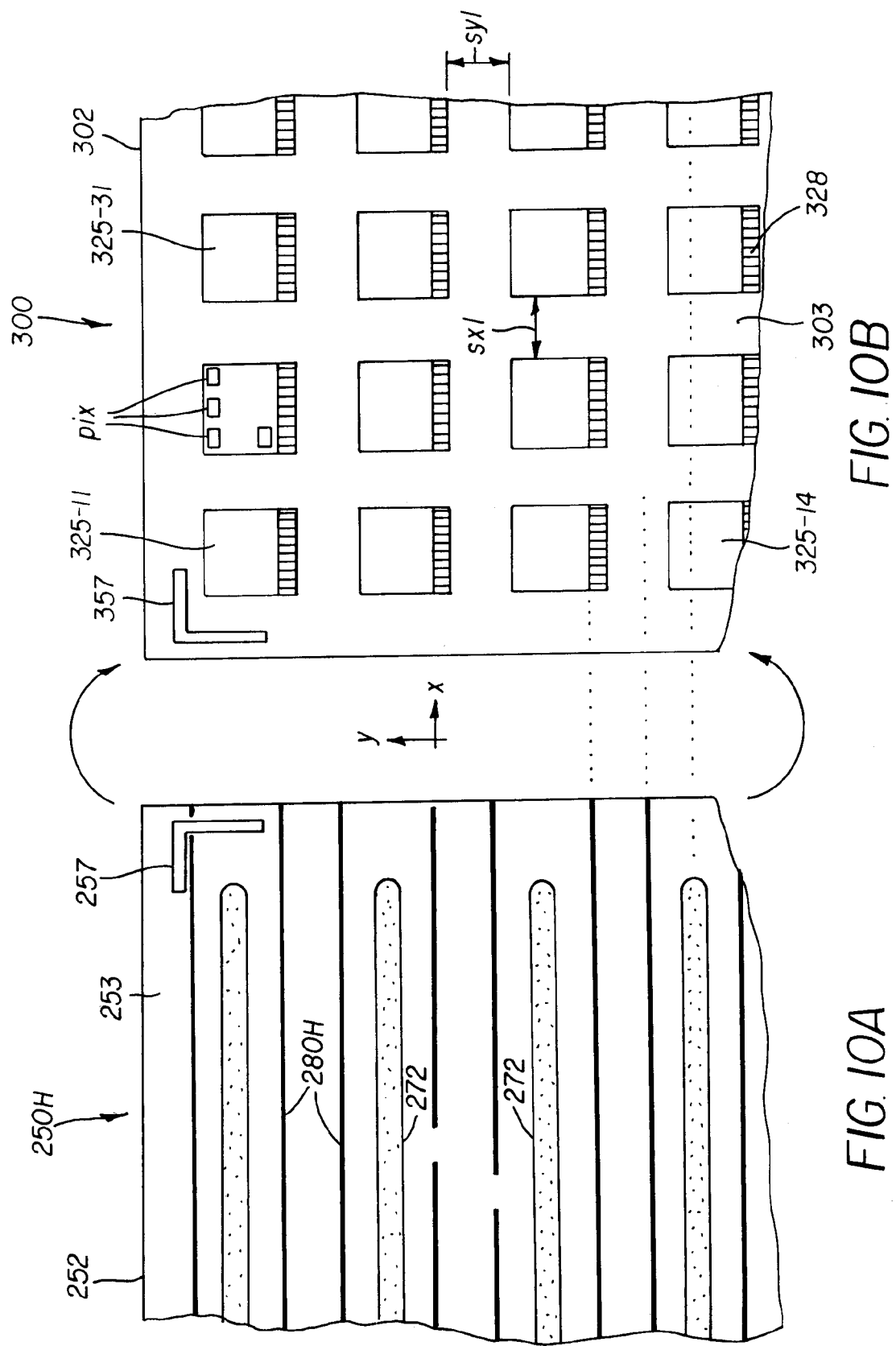

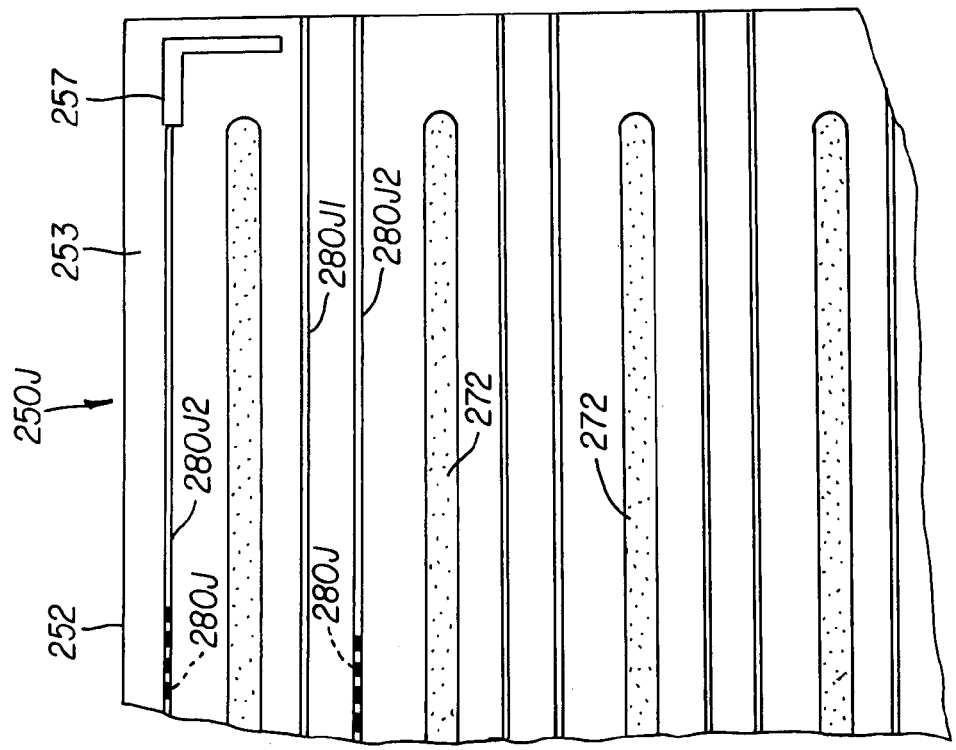
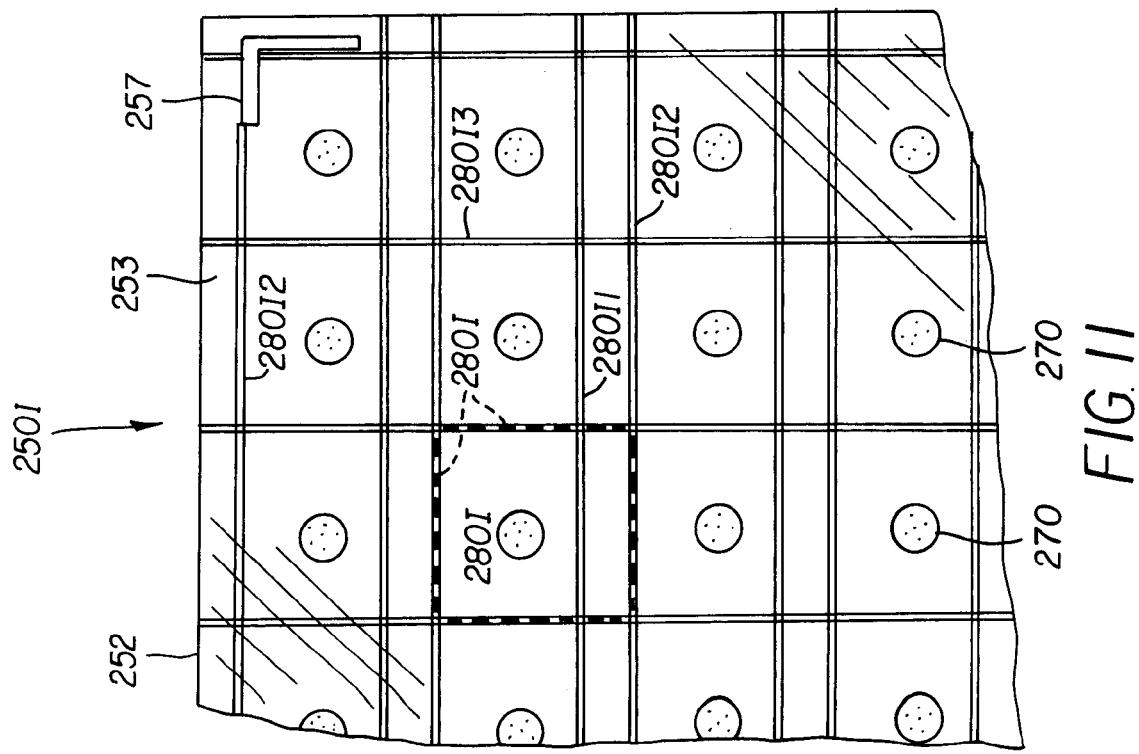

METHOD OF MAKING AN OLED DISPLAY DEVICE WITH ENHANCED OPTICAL AND MECHANICAL PROPERTIES

FIELD OF THE INVENTION

The present invention relates to protective packaging of top-emitting or bottom-emitting OLED devices. More particularly, the present invention is directed to a method of forming a structural buffer layer (SBL) for bonding a transparent cover plate over a plurality of OLED devices while keeping electrical interconnect areas of such devices free of SBL materials.

BACKGROUND OF THE INVENTION

Organic light-emitting diode (OLED) devices, also referred to as organic electroluminescent (EL) devices, have numerous well known advantages over other flat-panel display devices currently in the market place. Among these advantages are brightness of light emission, relatively wide viewing angle, reduced electrical power consumption compared to, for example, liquid crystal displays (LCDs) using backlighting, and a wider spectrum of colors of emitted light in full-color OLED displays.

Applications of OLED devices include active matrix image displays, passive matrix image displays, and area lighting devices such as, for example, selective desktop lighting devices. Irrespective of the particular OLED device configuration tailored to these broad fields of applications, all OLEDs function on the same general principles. An organic electroluminescent (EL) medium structure is sandwiched between two electrodes. At least one of the electrodes is light transmissive. These electrodes are commonly referred to as an anode and a cathode in analogy to the terminals of a conventional diode. When an electrical potential is applied between the electrodes so that the anode is connected to the positive terminal of a voltage source and the cathode is connected to the negative terminal, the OLED is said to be forward biased. Positive charge carriers (holes) are injected from the anode into the EL medium structure, and negative charge carriers (electrons) are injected from the cathode. Such charge carrier injection causes current flow from the electrodes through the EL medium structure. Recombination of holes and electrons within a zone of the EL medium structure results in emission of light from this zone that is, appropriately, called the light-emitting zone or interface. The emitted light is directed towards an observer, or towards an object to be illuminated, through the light transmissive electrode. If the light transmissive electrode is between the substrate and the light emissive elements of the OLED device, the device is called a bottom-emitting OLED device. Conversely, if the light transmissive electrode is not between the substrate and the light emissive elements, the device is referred to as a top-emitting OLED device.

The organic EL medium structure can be formed of a stack of sublayers that can include small molecule layers and polymer layers. Such organic layers and sublayers are well known and understood by those skilled in the OLED art.

In top-emitting OLED devices, light is emitted through an upper electrode or top electrode which has to be sufficiently light transmissive, while the lower electrode(s) or bottom electrode(s) can be made of relatively thick and electrically conductive metal compositions which can be optically opaque. Consequently, the lower electrodes (anodes) can be formed over relatively complex drive circuitry in an active matrix OLED image display. Top-emitting OLED displays offer the potential to improve display performance compared with bottom-emitting OLED displays by:

1) increasing the aperture ratio, therefore permitting pixels of the display to operate at a lower current density which results in improved operational stability;
2) permitting more complex drive circuitry to enable improved control of pixel current, leading to enhanced display uniformity and to improved display stability;
3) enabling the use of lower mobility materials, e.g., amorphous silicon, to be considered in forming the thin-film transistor (TFT) drive circuitry; and
4) permitting incorporation of elements which can increase the out-coupling of light generated within the organic EL medium structure to provide increased efficiency of emitted light.

However, bottom-emitting OLED devices continue to find widespread use in displays of data or in the field of advertising.

Unprotected OLED display devices, irrespective of device configuration, are prone to relatively rapid degradation of performance due to adverse effects of moisture and/or oxygen present in the ambient environment. Additionally, unprotected devices can be subject to mechanical damage caused by abrasion. Various efforts have been directed at providing packaged OLED displays in which the packaging approaches offer improved operational lifetime of displays which is, however, still limited so that widespread adoption of OLED display devices is currently restricted.

FIG. 1 is a schematic sectional view of a conventionally packaged OLED device in which a transparent cover plate is sealed to a device substrate by a perimeter seal. Moisture-absorbing desiccant material is provided in portions of the spacing between an uppermost surface of the OLED device and a lower surface of the cover plate. Alternatively, U.S. Patent Application Publication 2002/0187775A1 by Maruyama et al. incorporates an inert gas in the space between a device substrate and a second substrate which functions as a cover plate.

A perimeter seal is proposed by Maruyama et al. which is formed between two concave grooves disposed near perimeter areas of an OLED device. Since these concave grooves accept overflow of perimeter seal material during the pressing of a grooved cover plate to the device substrate, they do not prevent flow of the perimeter seal material into the concave grooves. Maruyama et al. do not disclose any flow-preventing elements for flowable material residing over the display area of an OLED device.

Wei et al. in U.S. Patent Application Publication 2002/0193035A1 disclose a package method and apparatus for organic electroluminescent display. A certain amount of an ultraviolet curing resin or thermal curing resin is spread on a lamination plate or a substrate. A trench is formed at an edge of the lamination plate. Upon aligning the lamination plate with the substrate, the space between the lamination plate and the substrate is controlled by adjusting lamination pressure so that excess resin flows into the trench at the edge of the lamination plate, and the dimensions of the package can be controlled. The resin is cured by ultraviolet radiation or by a thermal process.

All trench configurations in Wei et al. at edges of the lamination plate are perimeter trench configurations which accept overflow of excess resin material. The trenches in Wei et al. do not prevent flow of the perimeter seal material into the concave grooves.

Park et al. in U.S. Patent Application Publication 2002/0155320 A1 disclose a package method and apparatus for organic electroluminescent display. A trench is disposed on at least one of the cover plate or device substrate to prevent perimeter sealing material from contacting the display area of the OLED device. During pressing of the cover plate to the substrate, excess perimeter sealing material resin flows into the trench, and the sealing material is prevented from contacting the display area.

While perimeter seals offer improved moisture protection, the lack of structural buffer layer between the OLED device surface and the lower surface of the cover plate can cause mechanical and optical problems. Mechanical problems include excessive stress to the perimeter seal caused by thermal expansion and contraction under normal device operating conditions leading to leakage of the perimeter seal. Expansion of the gas in the space between the OLED device surface and the lower surface of the cover plate can lead to breakage of the device substrate or cover plate when subjected to lowered environmental pressure, especially for larger-sized displays. Optical problems include undesirable reflective or refractive optical effects at both surfaces of a transparent cover plate which is used in a top-emitting OLED display device.

U.S. Pat. No. 6,268,695, assigned to Battelle Memorial Institute, describes an environmental barrier for an OLED in which a glass cover plate is not used. In this invention, the foundation and the cover plate are coated with three layers: a first polymer layer; a ceramic layer; and a second polymer layer. Either the ceramic layer(s) in the foundation, the cover plate, or both, are substantially transparent to the light emitted by the OLED. This invention creates an environmental barrier for an OLED display, but does not provide mechanical protection for the OLED display, especially from pressure points such as those created when a user touches the surface of the display with his or her finger.

Other effective barrier layers against moisture penetration and/or oxygen penetration into an OLED device include a transparent encapsulation layer which can be formed by known thin-film deposition methods such as, for example, thermal vapor deposition, sputter deposition, or atomic layer deposition. Materials particularly suitable as encapsulation layer materials include aluminum oxide ($Al_2O_x$), silicon nitride (SiN), silicon-oxinitride ($SiO_xN_{1-x}$), and tantalum oxide ($TaO_x$).

Due to the structure of the thin film encapsulation layers, they do not provide adequate mechanical protection. A transparent cover plate is required to ensure mechanical protection. However, conventional perimeter sealing of the cover plate to the OLED display substrate results in the aforementioned mechanical and optical problems.

In manufacturing OLED display devices, a plurality of devices are typically manufactured on a device substrate, and are subsequently singulated or cut and separated from the device substrate. Each OLED display device includes a pixelated display area and an electrical interconnect area which is used to connect the singulated OLED display device to external electrical power and control electronics.

Irrespective of the configuration of environmental protection elements, such as an encapsulation layer and a perimeter-sealed cover plate, or just a perimeter-sealed cover plate, it is important to keep at least the outermost portions of the electrical interconnect area free of encapsulation layer material and of perimeter seal material to ensure reliable electrical connections to the interconnect area or areas.

Thus, a need exists for a manufacturing method of providing an environmental barrier over a plurality of OLED display devices formed on a common device substrate, with the environmental barrier having improved mechanical properties and providing improved out-coupling of light emission in singulated OLED devices, and the environmental barrier being configured so that electrical interconnect areas of singulated OLED devices are readily accessible for making reliable electrical connections of electrical leads.

SUMMARY OF THE INVENTION

It is therefore an object of the present invention to provide a method of bonding a transparent cover plate over a plurality of encapsulated top-emitting or bottom-emitting OLED devices formed on a device substrate which overcomes the problems of conventionally packaged OLED devices.

It is another object of the present invention to provide a method of forming a transparent structural buffer layer for uniformly bonding a transparent cover plate over selected portions of each of a plurality of encapsulated OLED devices formed on a device substrate.

It is a further object of the present invention to provide a method of packaging a plurality of encapsulated top-emitting or bottom-emitting OLED devices formed on a device substrate by providing a patterned transparent structural buffer layer for keeping at least outermost portions of electrical interconnect areas of such OLED devices accessible for connecting electrical leads thereto upon device singulation.

It is another object of the present invention to provide a method of bonding a cover plate over the entire display area of an OLED device with a minimal amount of structural buffer layer adhesive material.

It is a further object of the present invention to provide a method of forming a thin structural buffer layer for bonding a cover plate over the display area of an OLED device without the use of externally applied forces during the assembly of the cover plate to the device substrate.

These and other objects are achieved by a method of bonding a cover plate over OLED devices formed on a surface of a device substrate wherein each one of the OLED devices includes at least one electrical interconnect area, comprising:

a) providing a flow-preventing pattern on a surface of the cover plate or the OLED devices absent from the electrical interconnect areas of the OLED devices to prevent flow of a flowable adhesive material into at least the outermost portions of such interconnect areas;

b) dispensing a selected amount of a flowable curable adhesive material on the surface of the cover plate or the OLED devices in registration with the flow-preventing pattern; and c) engaging the cover plate in alignment with the substrate and curing the adhesive material.

BRIEF DESCRIPTION OF THE DRAWINGS

FIG. 2A is a schematic plan view of a transparent cover plate and showing a plurality of dispensed drops of a flowable and curable adhesive material;

FIG. 2B is a schematic plan view of a device substrate having a plurality of OLED devices including a pixelated display area and an electrical interconnect area;

FIG. 5A is a schematic plan view of a transparent cover plate having provided thereon a plurality of a second embodiment of rectilinear flow-preventing dam patterns and showing a dispensed drop of a flowable and curable adhesive material within each flow-preventing pattern;

FIG. 5B is the same plan view of the device substrate as shown in FIG. 2B;

FIG. 9A is a schematic plan view of a transparent cover plate having provided thereon a plurality of a sixth embodiment of sets of two interconnect area flow-preventing dam patterns and showing a dispensed drop of a flowable and curable adhesive material between the sets of interconnect area flow-preventing patterns, in accordance with an aspect of the present invention;

FIG. 9B is a schematic plan view of a device substrate having a plurality of OLED devices including a pixelated display area and two electrical interconnect areas;

FIG. 10A is a schematic plan view of a transparent cover plate having provided thereon a plurality of a seventh embodiment of unidirectional sets of two flow-preventing dam patterns and showing a dispensed line of a flowable and curable adhesive material between the sets of unidirectional flow-preventing patterns, in accordance with an aspect of the present invention;

FIG. 10B is the same plan view of the device substrate as shown in FIG. 2B;

FIG. 11 is a schematic plan view of a transparent cover plate having provided thereon a plurality of an eighth embodiment of rectilinear flow-preventing groove patterns and showing a dispensed drop of a flowable and curable adhesive material within each flow-preventing pattern, in accordance with an aspect of the present invention;

FIG. 12 is a schematic plan view of a transparent cover plate having provided thereon a plurality of a ninth embodiment of unidirectional sets of two flow-preventing groove patterns and showing a dispensed line of a flowable and curable adhesive material between the sets of unidirectional flow-preventing patterns, in accordance with an aspect of the present invention;

The drawings are necessarily of a schematic nature since layer thicknesses are frequently in the sub-micrometer range and pixel dimensions can be in a range of from 10-250 micrometer, while lateral dimensions of device substrates and of cover plates can be in a range of from 10-50 centimeter. Accordingly, the drawings are scaled for ease of visualization rather than for dimensional accuracy.

DETAILED DESCRIPTION OF THE INVENTION

As used herein, the term "transparent" refers to an encapsulation layer, a structural buffer layer, as well as anode electrode layer(s) and a device substrate in a bottom-emitting OLED device configuration, and a cover plate, and denotes an optical transmission of between 80% to 98% of light directed perpendicularly at a surface of such layers or plate, or device substrate. The term "pixel" is generally used to designate the smallest addressable element of a pixelated OLED display, and denotes herein the light-emitting portion of a pixel.

Figure 1:
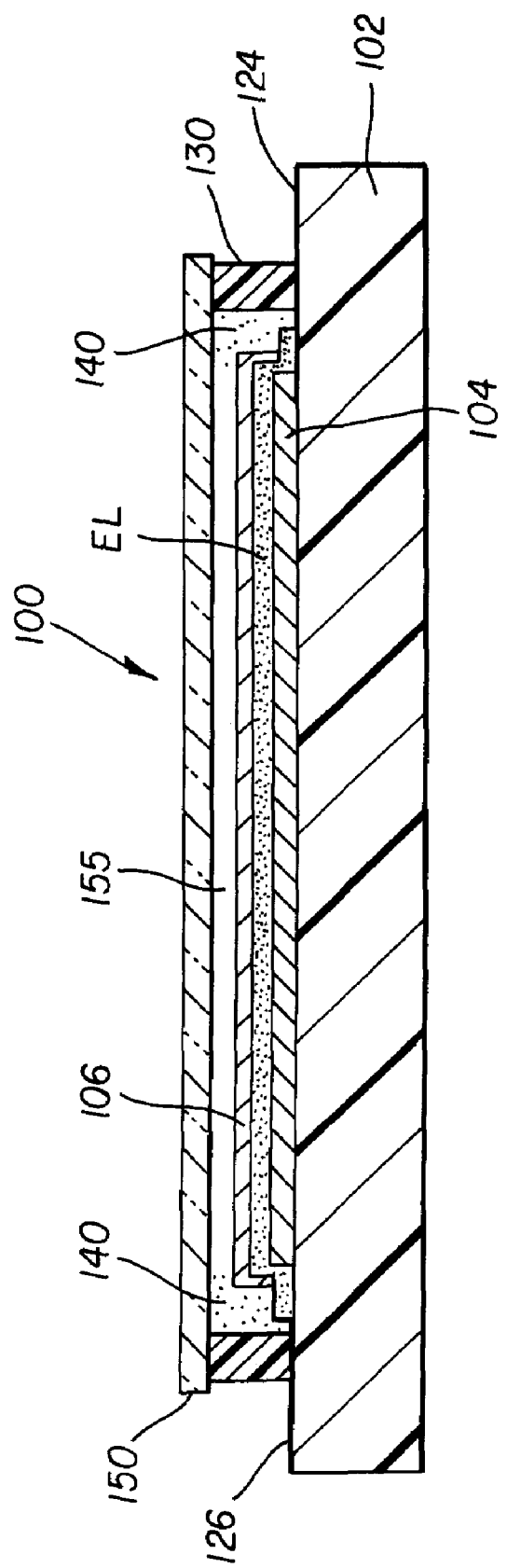
FIG. 1 is a schematic sectional view of a packaged OLED device having a cover plate bonded by a prior art method.

In order to more fully appreciate the method of the present invention, a conventionally packaged OLED device 100 having a transparent cover plate 150 bonded by prior art method is shown as a schematic sectional view in FIG. 1.

The conventionally packaged OLED device 100 includes a device substrate 102 on which is formed, in sequence, an anode electrode layer 104, an organic electroluminescent (EL) medium structure, and a cathode electrode layer 106. In a top-emitting OLED device, the cathode electrode layer 106 can be formed of a transparent electrically conductive material, and the anode electrode layer 104 as well as the device substrate 102 can be optically opaque. In a bottom-emitting OLED device, the cathode electrode layer 106 can be optically opaque, and the anode electrode layer 104, as well as the device substrate 102, are transparent members.

The anode electrode layer 104 is in electrical contact with a metallized conductor (not identified in the drawing) which extends laterally outwardly along a device substrate surface to provide an electrical interconnect area 124 for the anode or for each one of a plurality of anode electrode layers. Similarly, a metallized conductor (not identified in the drawing) is in electrical contact with the cathode electrode layer 106, and extends laterally outwardly along the device substrate surface to provide an electrical interconnect area 126 for the cathode or for each one of a plurality of cathode electrode layers.

A perimeter seal 130 is in sealing engagement with portions of the metallized conductors which provide the electrical interconnect areas 124 and 126, respectively, and the perimeter seal 130 is in sealing engagement with a peripheral area of a transparent cover plate 150. A spacing or a gap 155 exists between an upper surface of the cathode electrode layer 106 and a lower surface (not identified in drawing) of the cover plate 150. A dessicant material 140 is shown disposed within a portion of the spacing or gap 155 where light emission through the cover plate is not impeded in a top-emitting OLED device.

As described in the Background of the Invention, Maruyama et al. propose to fill the spacing 155 with an inert gas, as described in U.S. Patent Application Publication 2002/0187775 A1. It should be pointed out, however, that Maruyama et al. do not disclose or suggest the important feature of the electrical interconnect areas 124 and 126.

The perimeter seal 130 can be subject to mechanical failure or to leakage caused by normal thermally induced expansion or contraction of the cover plate 150, or of the device substrate 102, or of both elements, either during periods of device operation or during periods of device storage.

The spacing or gap 155, whether or not filled with an inert gas, can result in undesirable optical effects which at least include a reduced effectiveness of optical coupling between light generated within the EL medium structure and light directed to an observer through the transparent cover plate 150. Such undesirable optical effects are related to reflective and/or refractive effects at both cover plate surfaces (not identified in the drawing).

Furthermore, the perimeter seal 130 can be subject to a shearing load when the cover plate 150 experiences a downwardly directed force such as, for example, a force created in a central location of the cover plate 150 by the touch of an observer's hand or finger. Similarly, the perimeter seal 130 can experience a shearing load whenever cleaning of the upper surface of the cover plate is required such as, for example, cleaning of an OLED-based computer display panel.

FIG. 2A is a schematic plan view of a transparent cover plate configuration 250A which does not have an inventive flow-preventing pattern. A transparent cover plate 252 has dispensed on a first surface 253 a plurality of drops or dots 270 of a flowable and curable adhesive material. Each drop or dot 270 contains an identical selected amount of the adhesive material. The adhesive material has a preferred viscosity in a range of from 50-1000 centipoise (cp), and can be obtained from, for example, Electronic Materials, Inc. of Breckenridge, Colo., U.S.A., or from Emerson & Cuming, Inc. of Billerica, Mass., U.S.A.

The cover plate 252 includes an alignment mark 257 on the first cover plate surface 253, and the drops or dots 270 are dispensed from a dispensing apparatus to form a two-dimensional array as indicated by x-direction and y-direction coordinates.

The transparent cover plate can be a glass plate, a quartz plate, or a polymer plate such as, for example, a polycarbonate plate.

FIG. 2B is a schematic plan view of an OLED device configuration 300 which includes a plurality of OLED devices formed in a two-dimensional array on a first surface 303 of a device substrate 302. Each OLED device includes a pixelated display area 325 having picture elements or pixels "pix", and one electrical interconnect area 328. Neighbor OLED devices are separated by a spacing sx1 along an x-direction and by a spacing sy1 along a y-direction. Also formed on the first device substrate surface 303 is an alignment mark 357.

In order to preserve visual clarity of the drawing, the pixelated structure of an OLED display area is indicated schematically within the display area of only one OLED device. Also, the positions of only three pixelated OLED display areas 325 within the two-dimensional array are indicated at 325-11, corresponding to a position 1;1, 325-31, corresponding to a position 3;1, and 325-14, corresponding to a position 1;4.

The pixelated display areas 325 can be those of passive matrix OLED devices, or the pixelated display areas can be associated with active matrix OLED devices.

Viewing FIGS. 2A and 2B together, it will be apparent that the drops or dots 270 of the flowable and curable adhesive material are dispensed in a pattern which corresponds to the positions of the OLED devices within the two-dimensional array. More particularly, the drops or dots 270 are dispensed so that their centers are approximately aligned with a center position of each OLED display area 325, as indicated schematically by a dotted reference line (not identified) extending between FIGS. 2A and 2B.

The curved arrows (not identified) shown between the cover plate configuration 250A and the OLED device configuration 300 are intended to indicate the engagement of the cover plate's first surface 253 in alignment with the first surface 303 of the device substrate 302. Alternatively, the surface 303 of the device substrate can be brought into aligned engagement with the first cover plate surface 253. In both engagement procedures a video camera system monitors the positions of the alignment marks 257 and 357 at a proximity position between the cover plate configuration 250A and the OLED device configuration 300. One of these configurations is retained within a precision carriage such as, for example, a vacuum frame carriage, which can be translated manually or automatically in an x-direction, a y-direction, and a rotational direction to ensure alignment between the two configurations at engagement.

The use of a flowable and curable adhesive material is aimed at forming a transparent structural buffer layer ("SBL") of radiation-cured adhesive material for uniformly bonding the cover plate configuration with at least the display areas 325 of each one of the OLED devices, while leaving at least the outermost portions of the electrical interconnect areas 328 clear of adhesive material.

Figure 2C:
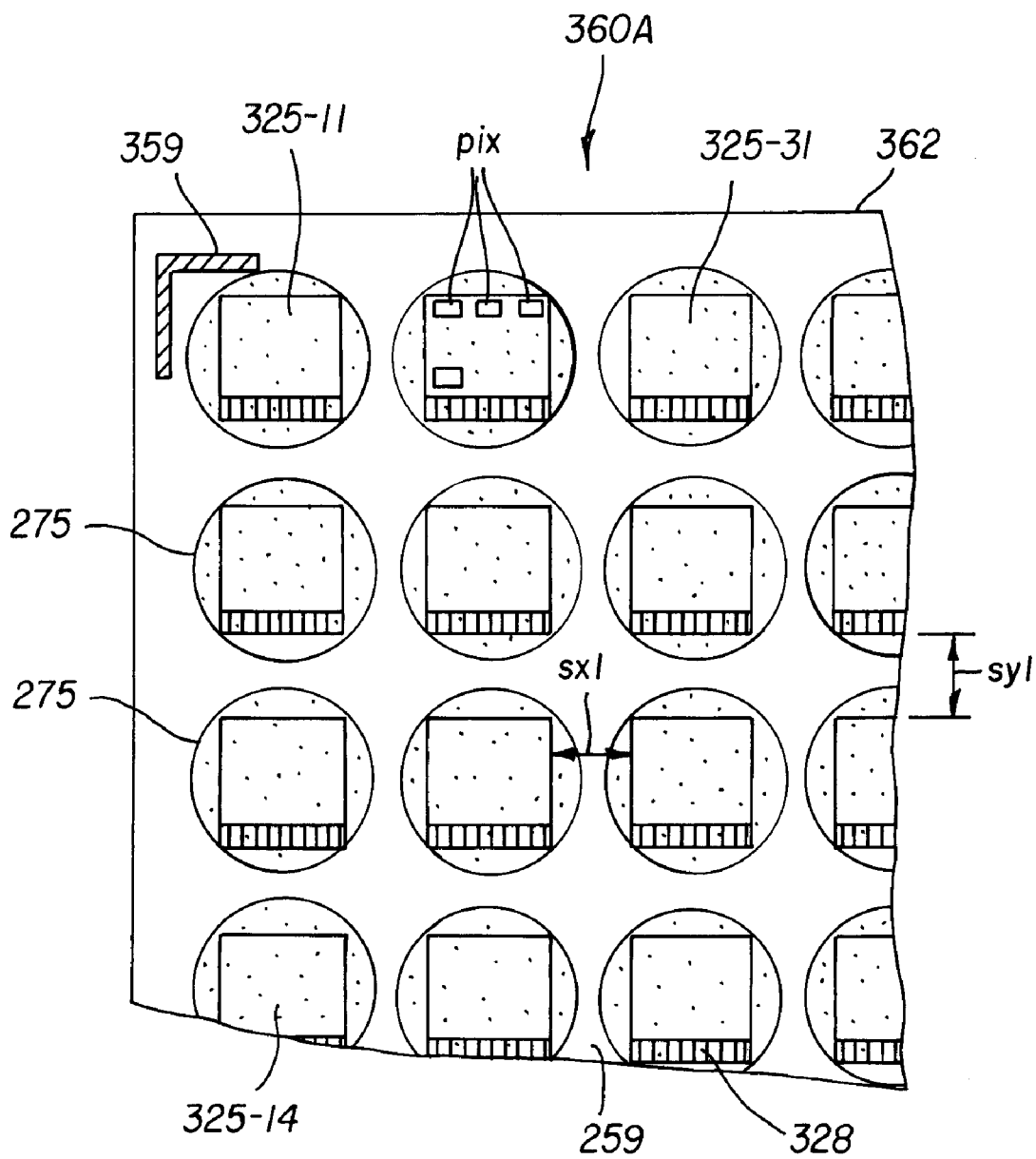
FIG. 2C depicts schematically an aligned assembly of the device substrate of FIG. 2B and the cover plate of FIG. 2A and showing spreading of the dispensed drops of the flowable adhesive material.

FIG. 2C depicts schematically a plan view, viewed through the cover plate 252, of an engaged and aligned assembly 360A, and indicating aligned alignment marks 359 by shading, as well as common edges 362 of the aligned cover plate 252 with the device substrate 302.

Upon engaging the cover plate 252 with the device substrate 302, the selected amount of flowable adhesive material dispensed as drops or dots 270 (see FIG. 2A) is shown to have been excessive since the unrestrained spread 275 of the drops or dots 270 by mere capillary action extends not only over the OLED display areas 325 as intended, but also over substantially the entire electrical interconnect areas 328.

Numerous experiments have been conducted with different selected dispensed amounts of the flowable adhesive material contained in the drops or dots 270. If the selected amount of flowable adhesive material in each drop or dot 270 is reduced sufficiently so that the spreading adhesive material upon engagement does not spread into or over the outermost portions of the electrical interconnect areas 328, the adhesive material also spreads incompletely or only partially over the OLED display areas 325. Thus, in a cured condition, the adhesive provides only a partial structural buffer layer over each display area, and consequently only partial bonding between each display area and the cover plate. Stated differently, it has been shown to be almost impossible, in the absence of flow-preventing patterns, to achieve a uniform structural buffer layer over at least the OLED display areas 325 while preventing spreading of flowable adhesive material into or over the electrical interconnect areas 328 for applications using the method of dispensing a patterned flowable adhesive.

Several non-limiting examples of inventive flow-preventing patterns will be described hereinafter. Flow-preventing patterns provided in the form of dams are shown in bold outline. Flow-preventing patterns provided in the form of grooves are shown in fine outline. Flow-preventing patterns include a pattern of at least one dam feature on the cover plate or a pattern of at least one groove feature in the cover plate. Flow-preventing patterns using a dam feature can be included not only on the cover plate, but on the device substrate or other portions of the OLED devices, as will be apparent to those skilled in the art.

Figures 3A, 3B:
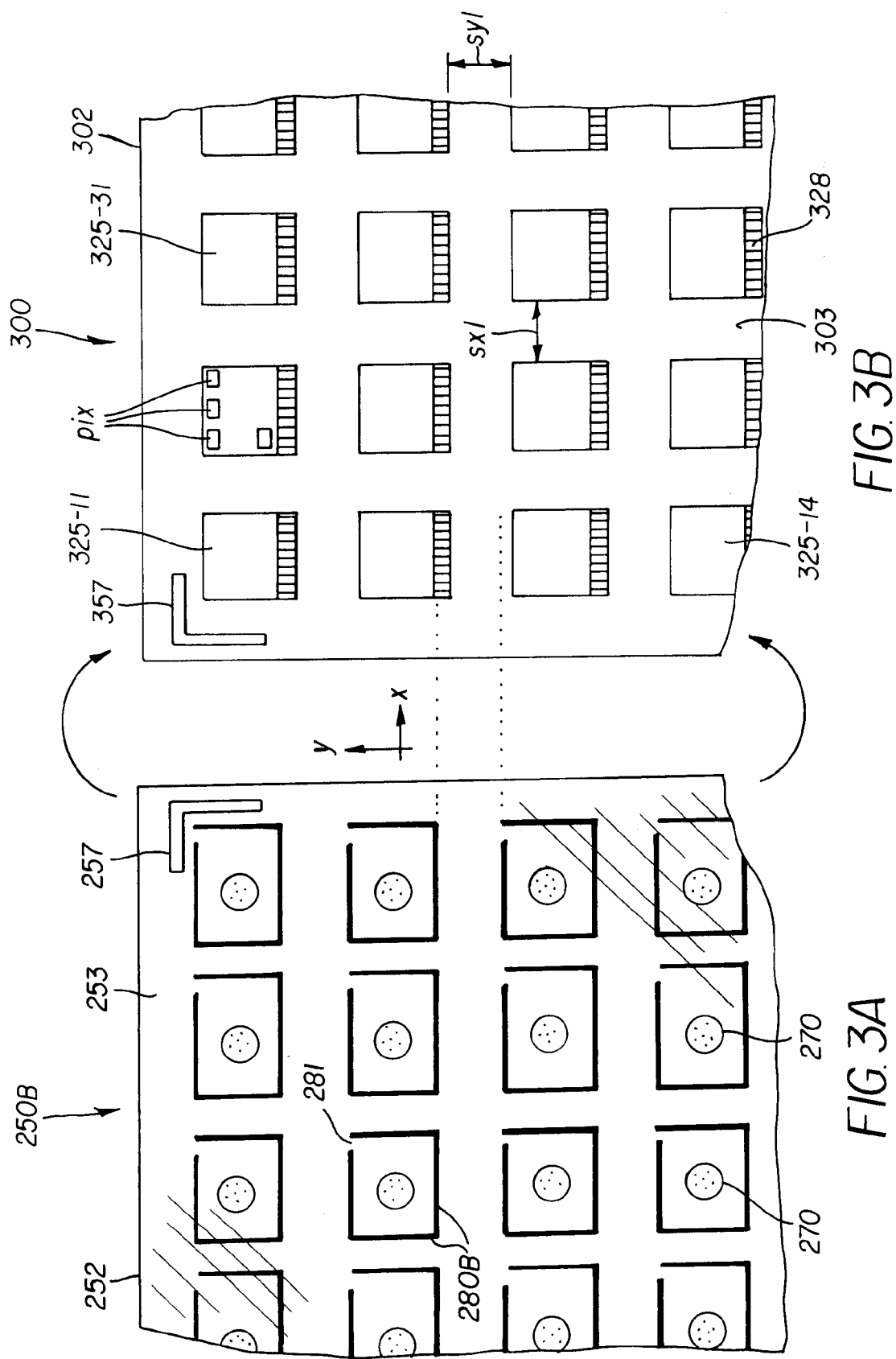
FIG. 3A is a schematic plan view of a transparent cover plate having provided thereon a plurality of a first embodiment of rectilinear flow-preventing dam patterns and showing a dispensed drop of a flowable and curable adhesive material within each flow-preventing pattern, in accordance with an aspect of the present invention.
FIG. 3B is the same plan view of the device substrate as shown in FIG. 2B.

Turning to FIGS. 3A and 3B, schematic plan views are shown of a cover plate configuration 250B which do have an inventive flow-preventing pattern and of an OLED device configuration 300, respectively. The OLED device configuration 300 is identical with the configuration described with reference to FIG. 2B.

The cover plate configuration 250B has provided over a first surface 253 of a transparent cover plate 252 a plurality of rectilinear flow-preventing dam patterns 280B, each pattern having one opening 281. The dam patterns are provided in a dispensing apparatus (not shown) which dispenses a substantially viscous non-flowable and curable adhesive material having a viscosity in a preferred range of 25,000-250,000 centipoise (cp). Such adhesive material is available from, for example, Three Bond Co., LTD. of Tokyo, Japan.

Figure 3C:
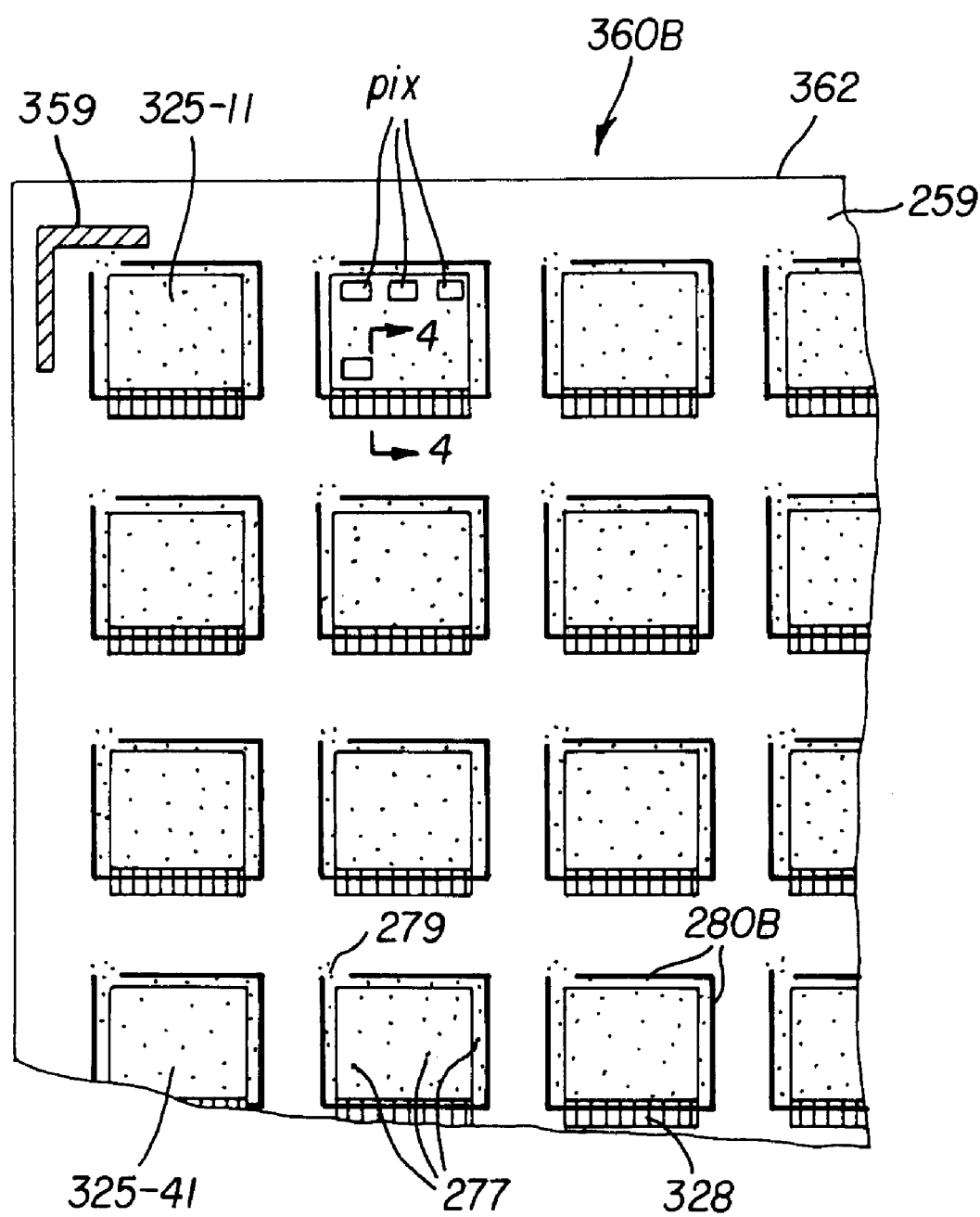
FIG. 3C indicates schematically an aligned assembly of the device substrate of FIG. 3B and the cover plate of FIG. 3A and showing uniform spreading of the flowable adhesive material within each flow-preventing pattern, and preventing flow of adhesive material into at least the outermost portions of electrical interconnect areas, in accordance with an aspect of the present invention.

As will be more readily apparent in FIG. 3C, the plurality of rectilinear dam patterns 280B are arranged in a two-dimensional layout which corresponds to the two-dimensional array of OLED devices provided on the first surface 303 of the device substrate 302. As indicated by dotted reference lines in an x-direction between FIG. 3A and FIG. 3B, lower segments of the dam patterns 280B align with such portions of the electrical interconnect areas 328 which are located in close proximity to the pixelated OLED display areas 325. Upper segments of the dam patterns 280B project to positions above upper edges (not identified in the drawings) of the pixelated OLED display areas 325.

A selected amount of a flowable and curable adhesive material is dispensed in the form of drops or dots 270 within each flow-preventing dam pattern 280B. The flowable and curable adhesive material has been described with reference to FIG. 2A.

The purpose of the inventive flow-preventing patterns in the form of dams or in the form of grooves is to prevent spreading of the flowable adhesive material into at least the outermost portions of the electrical interconnect areas 328 of the OLED devices, and to provide uniform spreading of the flowable adhesive material to a nearest edge or to nearest edges of the flow-preventing patterns so that, upon curing of the adhesive, a uniform transparent structural buffer layer provides uniform bonding between adhesive-containing areas of the cover plate 252 and at least the display areas 325 of each of the plurality of OLED devices on the device substrate 302.

FIG. 3C is a schematic plan view of an engaged and aligned assembly configuration 360B as seen through the transparent cover plate 252 from the second cover plate surface 259. Engaging the cover plate 252 with the device substrate occurs without externally applied forces.

Controlled spreading of the flowable adhesive material is indicated at 277, the spreading being controlled or confined by the flow-preventing dam patterns 280B. The selected amount of the flowable adhesive material flows to spread to a nearest edge or to nearest edges of the flow-preventing pattern(s), and being prevented from flowing or spreading into the flow-preventing pattern(s) so that outermost portions of the electrical interconnect areas 328 remain free from any adhesive material. Overflow 279 of any excess amount of flowable adhesive material can take place through the opening(s) 281 (see FIG. 3A) in the flow-preventing dam pattern 280B.

Alignment procedures prior to engaging the cover plate surface 253 and the device substrate surface 303 have been described previously with reference to FIG. 2C.

Figure 4:
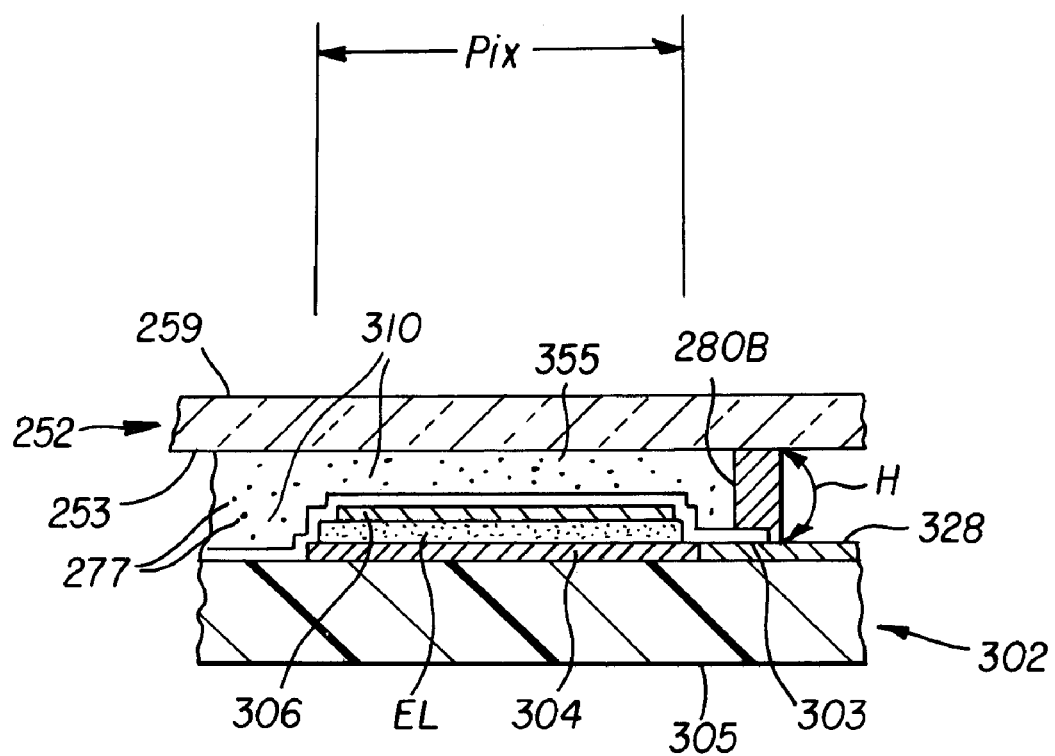
FIG. 4 is a schematic sectional view of a pixel of the assembly of FIG. 3C.

FIG. 4 is a schematic sectional view of a pixel "pix", taken along the section lines 4-4 of the assembly configuration 360B of FIG. 3C.

A device substrate 302 has opposing first and second surfaces 303 and 305, respectively. The pixel includes an anode electrode layer 304 formed on the first surface 303 of the device substrate 302. The anode electrode layer 304 is in electrical contact with a metallized conductor (not identified) which is a portion of the electrical interconnect area 328. An organic EL medium structure is provided over a portion of the anode electrode layer 304, and a cathode electrode layer 306 is provided over a portion of the EL medium structure. An electrical interconnect element or elements dedicated to the cathode electrode layer(s) is not shown in this drawing. A transparent encapsulation layer 310 fully encapsulates the pixel to provide an effective barrier against moisture penetration and oxygen penetration.

The flow-preventing dam pattern 280B is formed at a height dimension H to be in engagement with portions of the encapsulation layer 310 and with portions of the electrical interconnect area 328. The dam pattern 280B can also be included on the substrate. The dam pattern 280B has been provided on the first surface 253 of the cover plate 252, and the dam pattern provides for a uniform spacing 355 between the encapsulation layer 310 and the first cover plate surface 253 over the light-emitting portion "pix". This uniform spacing is filled uniformly with the spread adhesive material 277 in a form of a controlled spread of drops or dots which is in fluid engagement with the cover plate surface 253, and with an upper surface (not identified) of the encapsulation layer 310. A second surface of the cover plate 252 is indicated at 259. The height dimension H of the flow-preventing dam pattern 280B is selected so that (1) the height dimension H extends vertically beyond topological features of the encapsulated OLED devices, and (2) the height dimension provides the uniform spacing 355 between the encapsulation layer 310 and the first cover plate surface 253 so that such uniform spacing can be filled uniformly with the spread adhesive material 277.

FIG. 5A is a schematic plan view of a cover plate configuration 250C showing another embodiment of rectilinear flow-preventing dam patterns 280C provided on a first surface 253 of a transparent cover plate 252. Each dam pattern 280C includes a continuous segment 280C1 extending along an x-direction, and interrupted dam segments 280C2 extending in an x-direction and a y-direction. The interrupted dam segments 280C2 provide a plurality of openings 283.

The continuous dam segment(s) 280C1 are positioned so as to align with such portions of electrical interconnect areas 328 which are in proximity to OLED display areas 325, as indicated by a dotted reference line between FIG. 5A and FIG. 5B. FIG. 5B shows the configuration 300 of OLED devices having one electrical interconnect area, as described above with reference to FIG. 2B.

Drops or dots 270 of a flowable and curable adhesive material are shown dispensed within each one of the plurality of flow-preventing patterns 280C, as described with reference to FIG. 3A.

Figure 6:
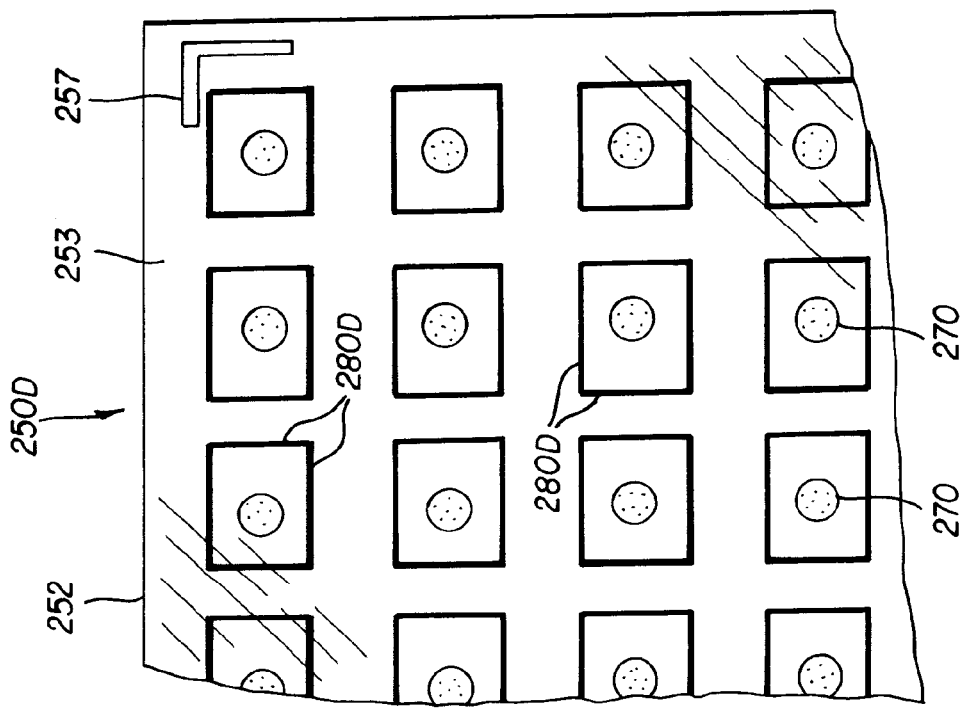
FIG. 6 is a schematic plan view of a transparent cover plate having provided thereon a plurality of a third embodiment of rectilinear flow-preventing dam patterns and showing a dispensed drop of a flowable and curable adhesive material within each flow-preventing pattern.

FIG. 6 is a schematic plan view of a cover plate configuration 250D showing another embodiment of rectilinear flow-preventing dam patterns 280D provided on a first surface 253 of a transparent cover plate 252 or on the substrate. The dam pattern 280D has a plurality of closed rectangular dams each of which has a drop 270 of a selected amount of a flowable and curable adhesive material dispensed within. It should be pointed out, however, that the use of a non-venting-type flow-preventing dam pattern such as rectilinear flow-preventing dam pattern 280D, may require the assembly of the cover plate 252 to the device substrate be performed in a low pressure environment, e.g., 10 Pascal. Said low pressure environment will avoid entrapped gas preventing proper flow and spreading of drop 270.

Figure 7:
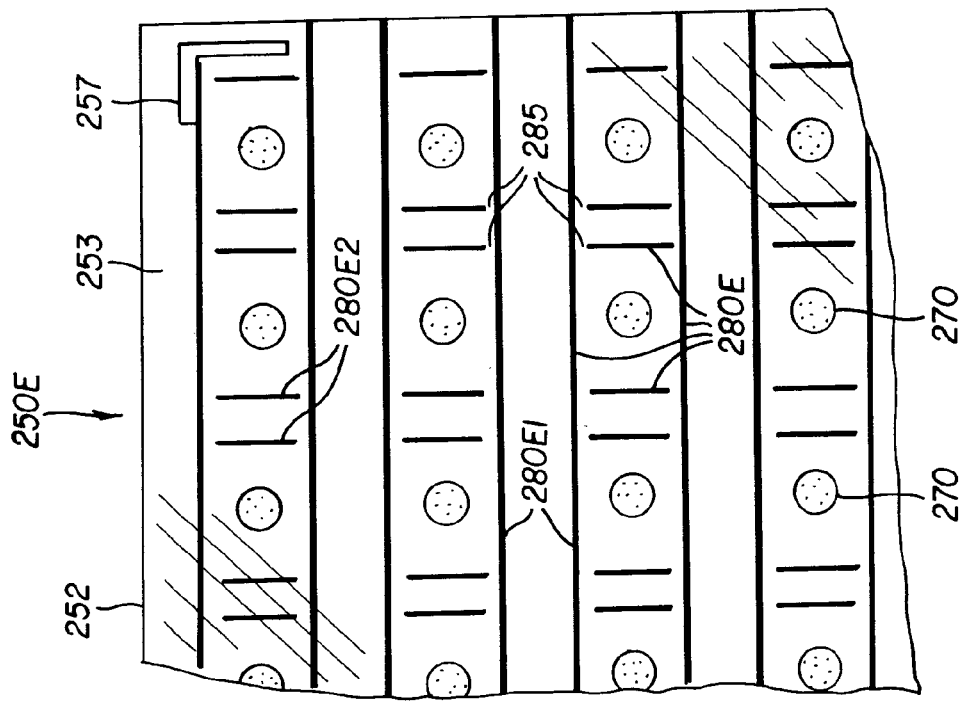
FIG. 7 is a schematic plan view of a transparent cover plate having provided thereon a plurality of a fourth embodiment of rectilinear flow-preventing dam patterns and showing a dispensed drop of a flowable and curable adhesive material within each flow-preventing pattern.

FIG. 7 is a schematic plan view of a cover plate configuration 250E showing another embodiment of rectilinear flow-preventing dam patterns 280E provided on a first surface 253 of a transparent cover plate 252. The dam pattern 280E includes continuous dams 280E1 and perpendicular dam segments 280E2 which provide four openings 285 within each individual pattern. Each one of the plurality of dam patterns 280E has a drop 270 of a selected amount of a flowable and curable adhesive material dispensed within.

Both cover plate configurations 250D and 250E include an alignment mark 257 for aligning each of these cover plate configurations with respect to a device substrate in a manner described previously with reference to FIG. 3C.

Figures 8A, 8B:
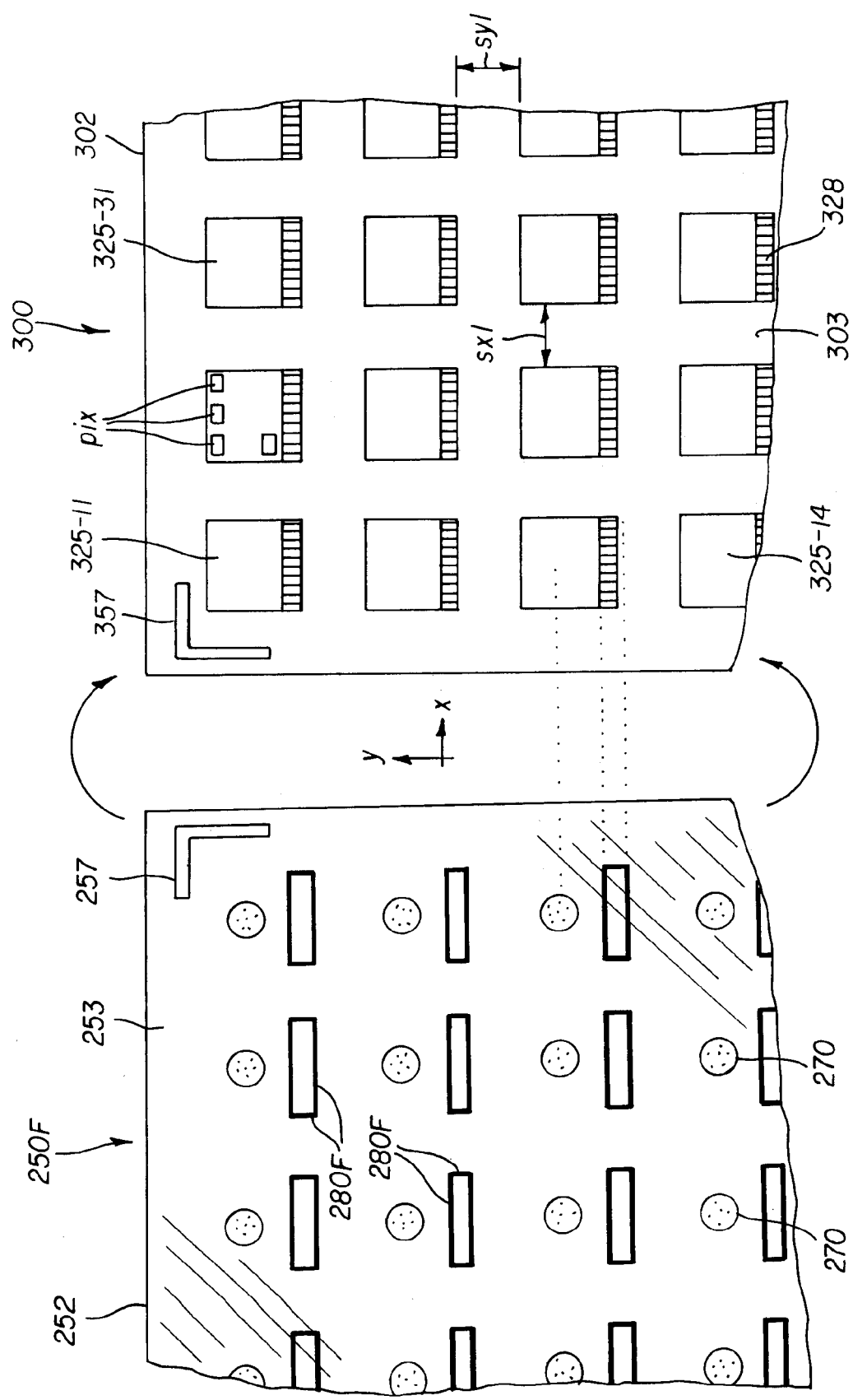
FIG. 8A is a schematic plan view of a transparent cover plate having provided thereon a plurality of a fifth embodiment of rectilinear interconnect area flow-preventing dam patterns and showing a dispensed drop of a flowable and curable adhesive material between the flow-preventing patterns, in accordance with an aspect of the present invention.
FIG. 8B is the same plan view of the device substrate as shown in FIG. 2B.

FIG. 8A is a schematic plan view of a cover plate configuration 250F showing a plurality of interconnect area flow-preventing dam patterns 280F provided on a first surface 253 of a transparent cover plate 252.

FIG. 8B shows the OLED device configuration 300 described previously with reference to FIG. 2B.

Viewing FIGS. 8A and 8B together, the interconnect area flow-preventing dam patterns 280F are positioned or arranged so that they align with respect to the electrical interconnect areas 328 of corresponding pixelated OLED devices, as indicated by dotted reference lines extending between FIG. 8A and FIG. 8B.

Drops 270 of a selected amount of a flowable and curable adhesive material are dispensed at positions with respect to the patterns 280F so that the drops establish fluid contact with an upper surface of an encapsulation layer (not identified) of respectively corresponding OLED display areas 325, as is also indicated by a dotted reference line extending between FIG. 8A and FIG. 8B.

FIG. 9A is a schematic plan view of a cover plate configuration 250G showing a plurality of dual-interconnect area flow-preventing dam patterns 280G provided on a first surface 253 of a transparent cover plate 252 or on the substrate.

FIG. 9B is a schematic plan view of an OLED device configuration 300-2 in which each one of a plurality of OLED devices includes a pixelated display area and two electrical interconnect areas 328 and 329.

Viewing FIGS. 9A and 9B together, each flow-preventing pattern 280G includes a first interconnect area flow-preventing dam pattern 280G1 to prevent spreading of a flowable and curable adhesive material into at least the outermost portions of a corresponding electrical interconnect area 328, and a second interconnect area flow-preventing dam pattern 280G2 to prevent spreading of the flowable adhesive material into at least the outermost portions of a corresponding second electrical interconnect area 329.

If an OLED device configuration is provided in which a pixelated display area is surrounded on three sides, or on all four sides, by an electrical interconnect area, a corresponding interconnect area flow-preventing dam pattern can be provided on the cover plate surface 253 or on the substrate.

The OLED devices in device configuration 300-2 are shown having the same pixelated display areas 325-11, 325-31, and 325-14 as described above with reference to FIG. 2B. Therefore, the spacing sy1 between neighbor devices in a y-direction remains, but the spacing sx2 along an x-direction is reduced with respect to the spacing sx1 by the introduction of the second electrical interconnect area 329.

Drops or dots 270 of a flowable and curable adhesive material are dispensed on the cover plate surface 253 in registration with the pattern 280G, and in a manner described with reference to FIG. 2A and FIG. 3A.

FIG. 10A is a schematic plan view of a cover plate configuration 250H showing a plurality of sets of two unidirectional flow-preventing dam patterns 280H, and a unidirectionally dispensed line or bead of a flowable and curable adhesive material formed between neighbor sets of the dam patterns 280H.

FIG. 10B shows the OLED device configuration 300 described previously with reference to FIG. 2B.

As indicated by dotted reference lines extending between FIG. 10A and FIG. 10B, one unidirectional flow-preventing dam of the set aligns with such portions of the OLED electrical interconnect areas 328 which are located in proximity to corresponding OLED display areas 325. The other unidirectional flow-preventing dam of the set aligns in spaced relationship with edges of the display areas 325 which are located opposite the interconnect areas 328. The unidirectionally dispensed lines or beads 272 align with the pixelated display areas 325 and extend along an x-direction across and between such display areas.

As described with reference to FIG. 4, a height dimension H of the flow-preventing dam patterns is selected on the basis of topological features of the OLED devices. An amount of the flowable adhesive material 277 is then selected to be dispensed, such selected amount, in turn, corresponding to the selected height dimension H.

Upon engaging the cover plate 252 with the device substrate 302, the flowable adhesive material 277 spreads laterally until the spreading stops at the inner edge or at the inner edges of the flow-preventing dam pattern(s).

Spreading of the flowable adhesive material can be facilitated by concurrently engaging and heating the cover plate 252 and the device substrate 302 to a temperature in a range from 40-80° C. Such temperature is insufficient to cause thermally-induced curing of the adhesive materials.

As indicated above, the flow-preventing dam patterns can be formed on the device substrate 102, and the flowable adhesive material can be dispensed into the flow-preventing dam patterns formed on the device substrate. Alternatively, the flowable adhesive material can be dispensed on the cover plate in registration with the flow-preventing dam patterns formed on the device substrate.

Figures 13A, 13B:
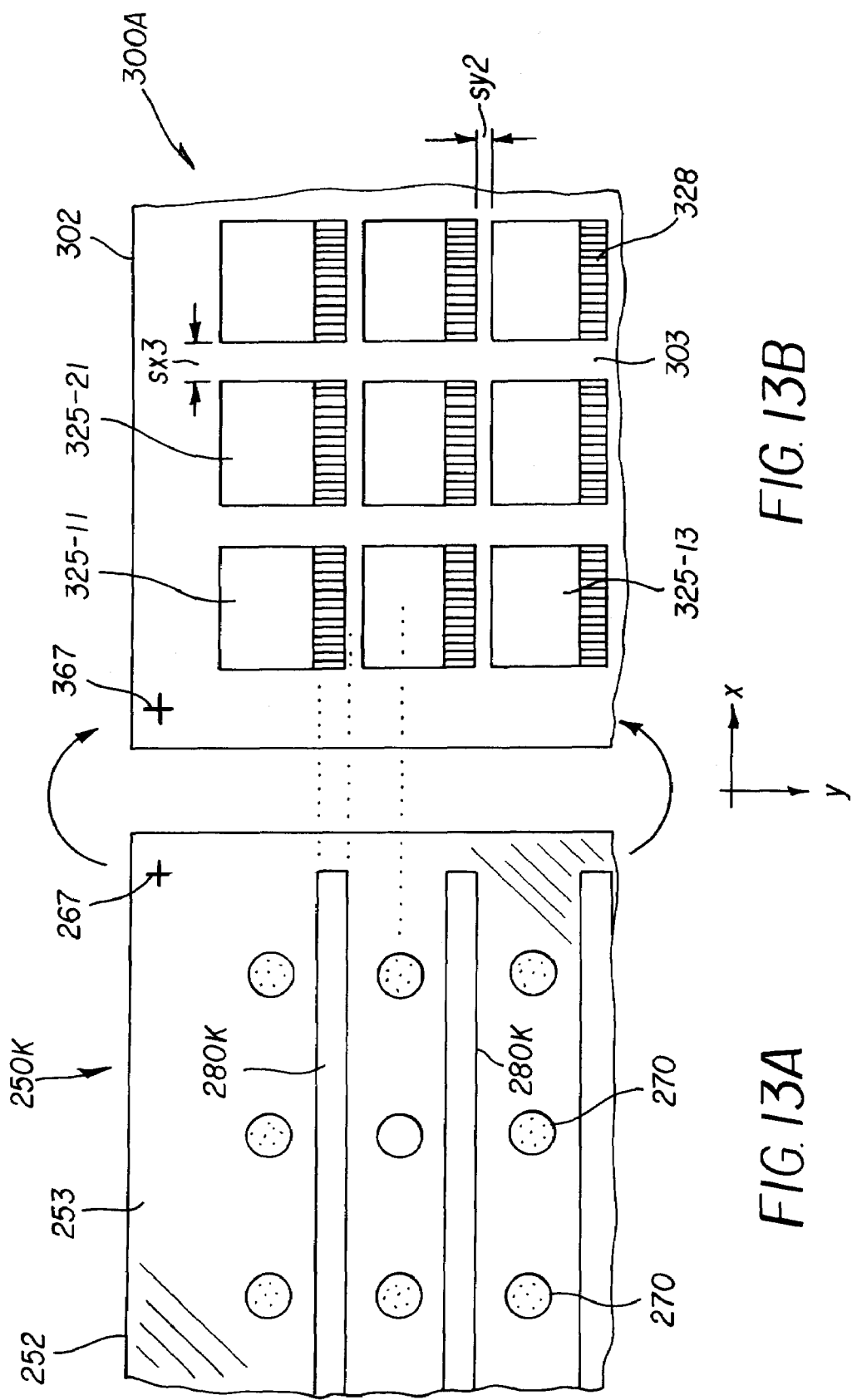
FIG. 13A is a schematic plan view of a transparent cover plate having provided thereon a plurality of a tenth embodiment of unidirectional flow-preventing single-groove patterns and showing dispensed drops of a flowable and curable adhesive material between the groove patterns, in accordance with an aspect of the present invention.
FIG. 13B is a schematic plan view of a device substrate having a plurality of more closely spaced OLED devices.

FIGS. 11, 12, and 13A show flow-preventing patterns provided in the form of grooves which can be made to extend partially into a transparent cover plate 252 from a cover plate surface 253. Grooves and groove configurations can be made, for example, by machining or by etching through openings in an overcoated and patterned photoresist layer which is subsequently removed.

It has been found unexpectedly that groove patterns can be effective flow-preventing patterns if (1) the grooves have sharp edges preferably without chips or imperfections at the first cover plate surface 253; and (2) a groove depth is a minimum of 50 micrometers but more preferably 300 micrometers; and (3) a groove width is a minimum of 0.5 mm but more preferably 1.0 mm. In addition, surfaces within the groove are preferably smooth and possess surface tension characteristics that do not facilitate the wetting of the flowable and curable adhesive material.

FIG. 11 is a schematic plan view of a cover plate configuration 250I showing a plurality of rectilinear flow-preventing groove patterns 280I, depicted in dashed outline along lateral centers of the grooves that may also define the location of the OLED device edges for singulation.

Each flow-preventing groove pattern 280I includes interconnect area flow-preventing grooves 280I1; flow-preventing grooves 280I2; and flow-preventing grooves 280I3. Flow-preventing grooves 280I2 also prevent spreading of the flowable adhesive material into the electrical interconnect area(s) from spreading adhesive material contained in vertically adjacent rows of OLED devices.

A selected amount of a flowable and curable adhesive material is dispensed in the form of drops or dots 270 within each groove pattern 280I.

FIG. 12 is a schematic plan view of a cover plate configuration 250J showing another embodiment of a flow-preventing groove pattern 280J, indicated schematically in dashed outline along lateral centers of this unidirectional pattern which includes grooves 280J1 and grooves 280J2.

Grooves 280J1 are interconnect area flow-preventing grooves which can also serve as singulation markers for cover plate singulation over device interconnect areas. Grooves 280J2 are flow-preventing grooves which can also serve as singulation markers for device substrate singulation and for cover plate singulation.

A selected amount of a flowable and curable adhesive material is dispensed in the form of a unidirectional line or bead 272 within each groove pattern 280J.

Turning to FIG. 13A and FIG. 13B, schematic plan views are shown of a cover plate configuration 250K and of an alternative OLED device configuration 300A, respectively.

The alternative OLED device configuration 300A includes a plurality of OLED devices which are provided over a first surface 303 of a device substrate 302. Each OLED device includes a pixelated (not identified in this drawing) display area 325 and an electrical interconnect area 328. Three display areas are indicated at 325-11, 325-21, and 325-13. An alternative alignment mark 367 is provided on the first surface 303.

The spacing between neighbor OLED devices along an x-direction and along a y-direction is shown reduced, compared to the previously described OLED device configuration 300. The spacing sy2 is substantially smaller than the spacing sy1 of configuration 300, and the spacing sx3 is shown to be less than the spacing sx1 of configuration 300. In order to increase manufacturing yield of OLED devices, it is generally desirable to provide a largest possible number of devices on a device substrate having a given size or area. Accordingly, it is generally desirable to reduce the spacings sx1, sy1, sx2, sy2, and sx3 between OLED devices to the smallest practical dimensions.

Since sy2<<sy1, the cover plate configuration 250K includes a unidirectional flow-preventing groove pattern 280K which comprises relatively wide parallel single grooves. An alternative alignment mark 267 is provided on the first surface 253 of the cover plate 252.

A selected amount of a flowable and curable adhesive material is dispensed in the form of drops or dots 270 between grooves 280K and in correspondence with positions of display areas 325 of the OLED devices in the device configuration 300A. The positional relationships between the OLED devices and the grooves 280K, and with the drops 270, is depicted by dotted reference lines extending between FIG. 13A and FIG. 13B.

Figure 14A:
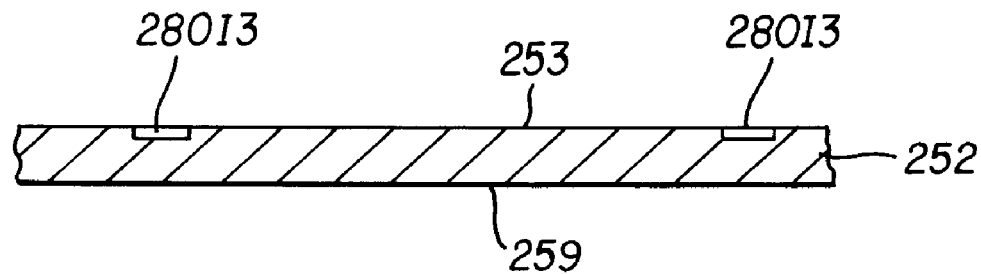
FIG. 14A is a schematic sectional view of a portion of a transparent cover plate having formed therein a flow-preventing pattern of grooves corresponding to one portion of the rectilinear groove pattern of FIG. 11.
Figure 14B:
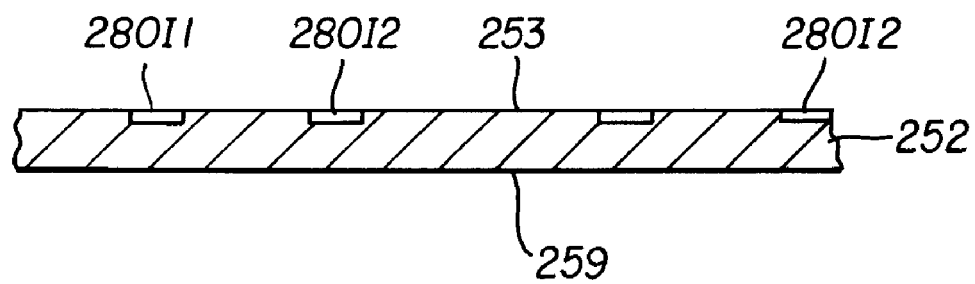
FIG. 14B is a schematic sectional view of a portion of a transparent cover plate having formed therein a flow-preventing pattern of grooves corresponding to another portion of the rectilinear groove pattern of FIG. 11.
Figure 14C:
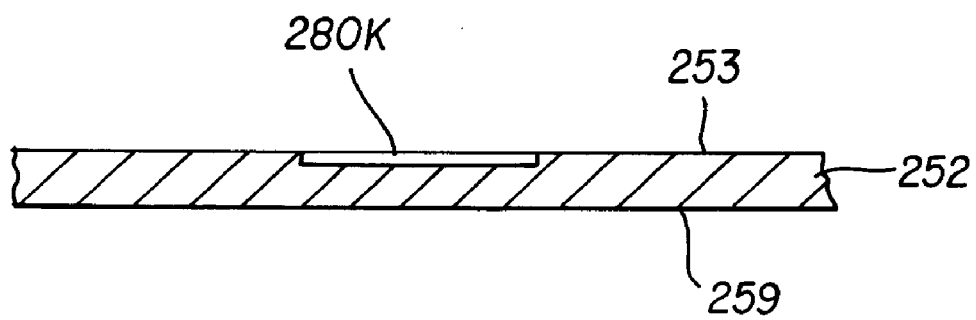
FIG. 14C is a schematic plan view of a portion of a transparent cover plate having formed therein a flow-preventing groove corresponding to the single-groove pattern of FIG. 13A.

FIG. 14A-14C are schematic sectional views of a cover plate 252 having opposing first and second surfaces 253 and 259, respectively, and showing groove patterns extending partially into the cover plate from the first surface 253.

FIG. 14A depicts the grooves 280I3 of the groove pattern 280I of FIG. 11.

FIG. 14B shows the grooves 280I1 and 280I2 of the groove pattern 280I of FIG. 11.

FIG. 14C indicates a groove 280K of the unidirectional groove pattern of FIG. 13A.

Figure 15:
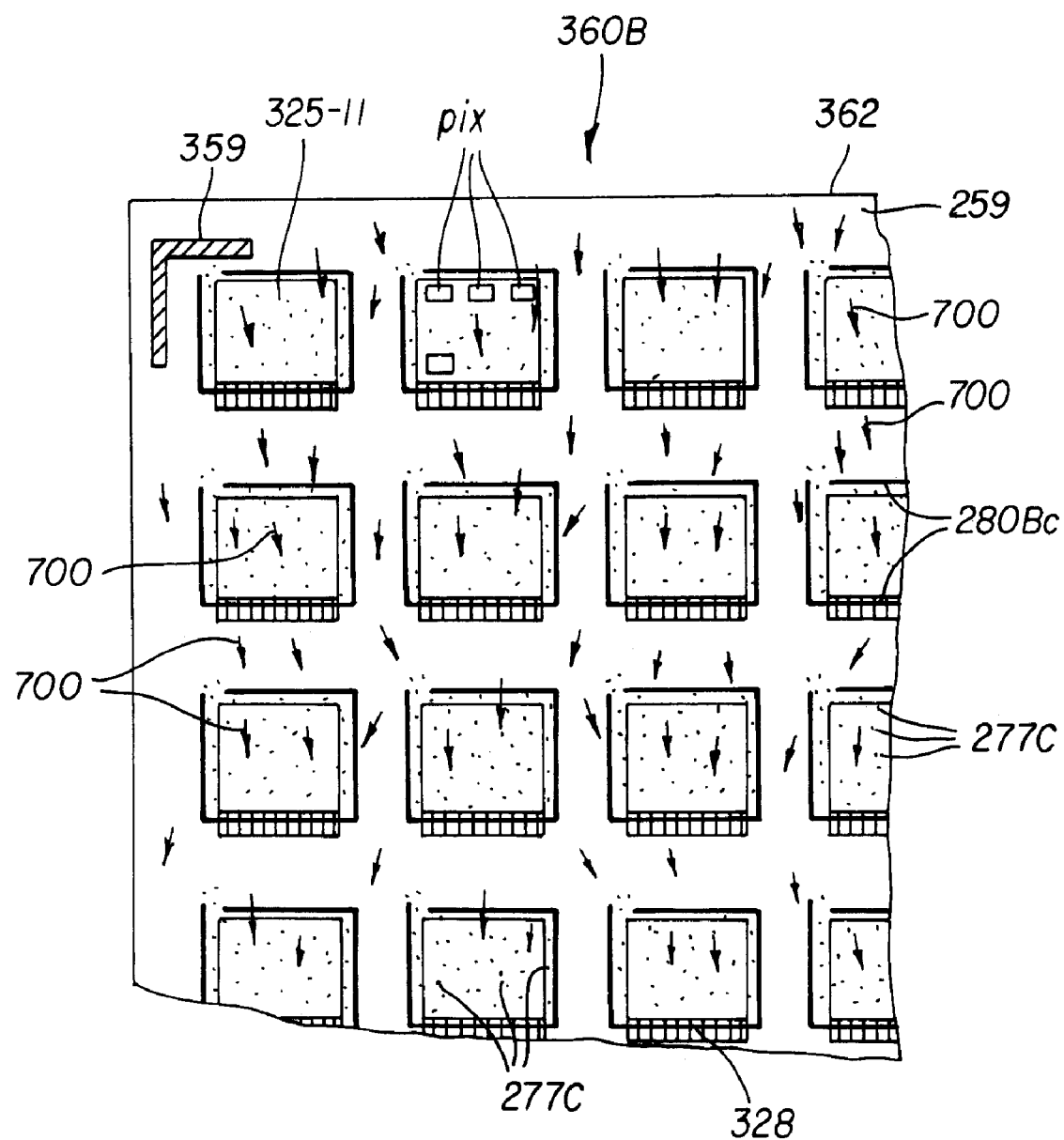
FIG. 15 is a schematic plan view of the aligned assembly of FIG. 3C and showing curing radiation directed through the transparent cover plate for curing the adhesive material and the flow-preventing pattern to provide a transparent structural buffer layer.

Turning to FIG. 15, a preferred curing process is indicated schematically in curing the spread adhesive material 277 in a form of controlled spread of drops or dots of the engaged and aligned assembly configuration 360B of FIG. 3C.

Curing radiation 700 is directed at the second surface 259 of the transparent cover plate 252 (see FIG. 3A). At least a fraction of the curing radiation 700 is transmitted through the cover plate for impinging on the adhesive material and curing it to provide a structural buffer layer extending at least over the display area 325 of each OLED device. The cured adhesive layer, e.g., the structural buffer layer, is designated at 277c. The structural buffer layer 277c can have a thickness in a range of from 1-50 micrometer.

Concurrently, the curing radiation 700 cures the flow-preventing dam patterns 280B to provide a cured dam pattern 280Bc.

Conventionally, curing of both the flowable adhesive material and the substantially viscous adhesive material forming the flow-preventing dam patterns is achieved by using curing radiation which includes a spectral distribution extending into the near-ultraviolet region.

As is well known to practitioners in the field of photolithography, spectral sensitizing materials can be incorporated into radiation-responsive materials such as, for example, photoresist materials, so as to extend the radiation response of such materials into the visible region of the spectrum. Furthermore, sensitizing materials are known which bleach while being exposed to radiation in a spectral region including blue light in a wavelength range of 400-500 nm. An exemplary class of sensitizing materials useful in extending the spectral range of curing radiation into a blue light wavelength range of 400-450 nm includes keto-coumarin materials. Accordingly, curing the adhesive materials in the assembly 360B is not restricted to using curing radiation 700 having the spectral distribution extending into the near-ultraviolet region.

Figure 16:
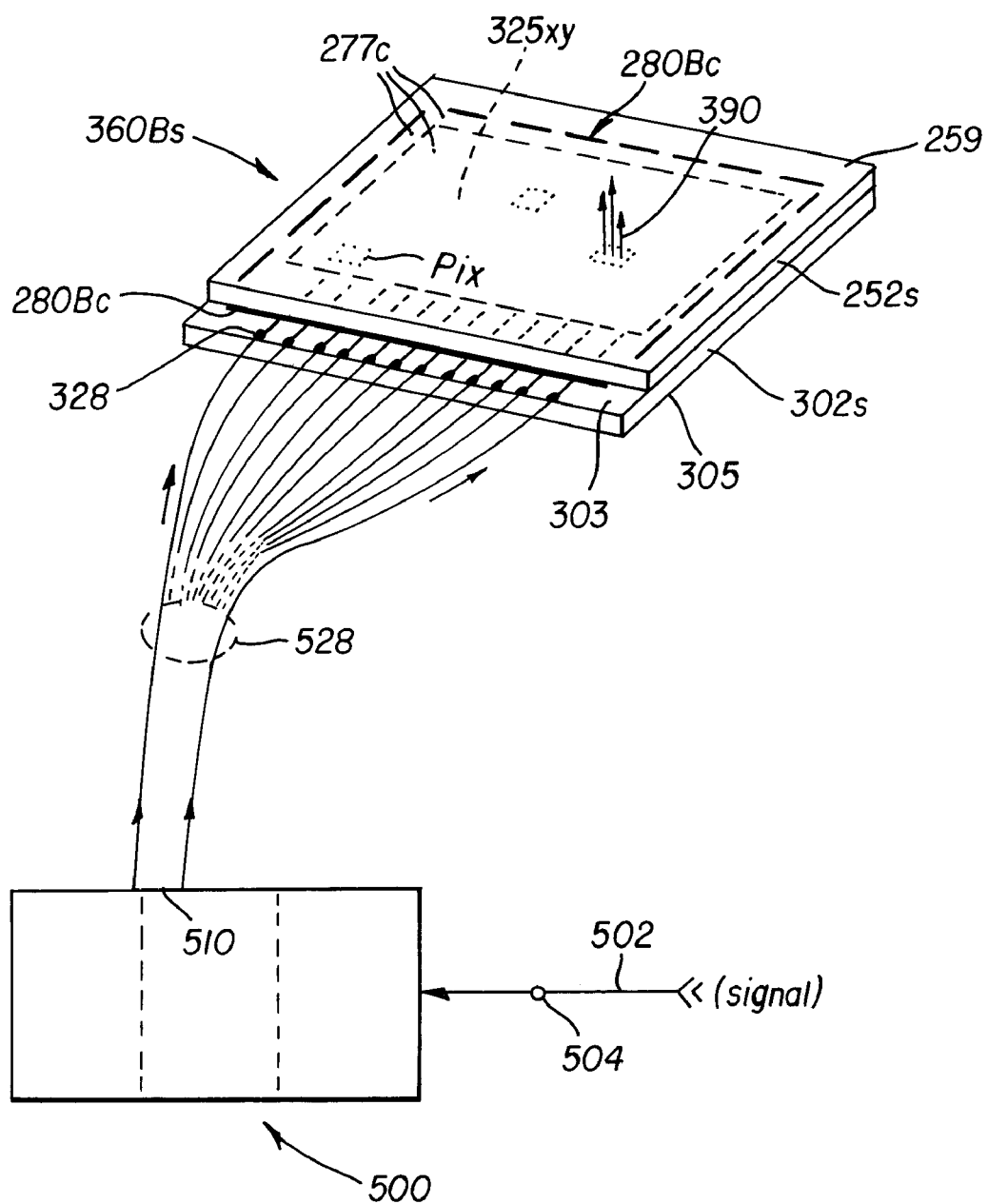
FIG. 16 is a schematic perspective view of a singulated packaged OLED device made by the method of the present invention and operative to provide light emission from a pixel.

Turning to FIG. 16, a schematic perspective view is shown of a singulated packaged OLED device 360Bs having the structural buffer layer in the form of the cured adhesive material 277c and disposed within the cured flow-preventing dam pattern 280Bc.

The singulated device substrate 302s and the singulated transparent cover plate 252s share common singulated dimensions along three edges. In order to reveal, and make accessible, at least the outermost portions of the electrical interconnect area 328, the singulation of the cover plate is offset laterally with respect to the device substrate along the interconnect area.

First and second surfaces 303 and 305, respectively, of the singulated device substrate 302s are shown. Also indicated is the second surface 259 of the singulated transparent cover plate 252s.

Light emission 390 from a pixel is directed toward an observer through the cover plate and its second surface 259. Light emission, of any one pixel at an instant of time, occurs in response to electrical drive signals and electrical control signals provided at the electrical interconnect area 328 by electrical leads 528 connected there to. Electrical leads 528 are the output leads issuing from an output terminal 510 of a power supply, scan line generator, and signal processor 500 which, in turn, receives an input signal at an input terminal 504 via a signal lead 502.

The pixelated display area 325-xy (and its associated electrical interconnect area 328) can be that of any of the OLED devices singulated from the assembly 360B of FIG. 15.

Although not shown in the drawings, the inventive method can be used equally effectively to bond a transparent cover plate over a plurality of encapsulated bottom-emitting OLED devices formed on a surface of a transparent device substrate. Such bottom-emitting OLED devices can be active matrix or passive matrix devices. The cover plate is transparent so that curing radiation can be transmitted through the cover plate for curing the spread adhesive material and flow-preventing dam pattern(s), thereby forming the structural buffer layer.

Figure 17:
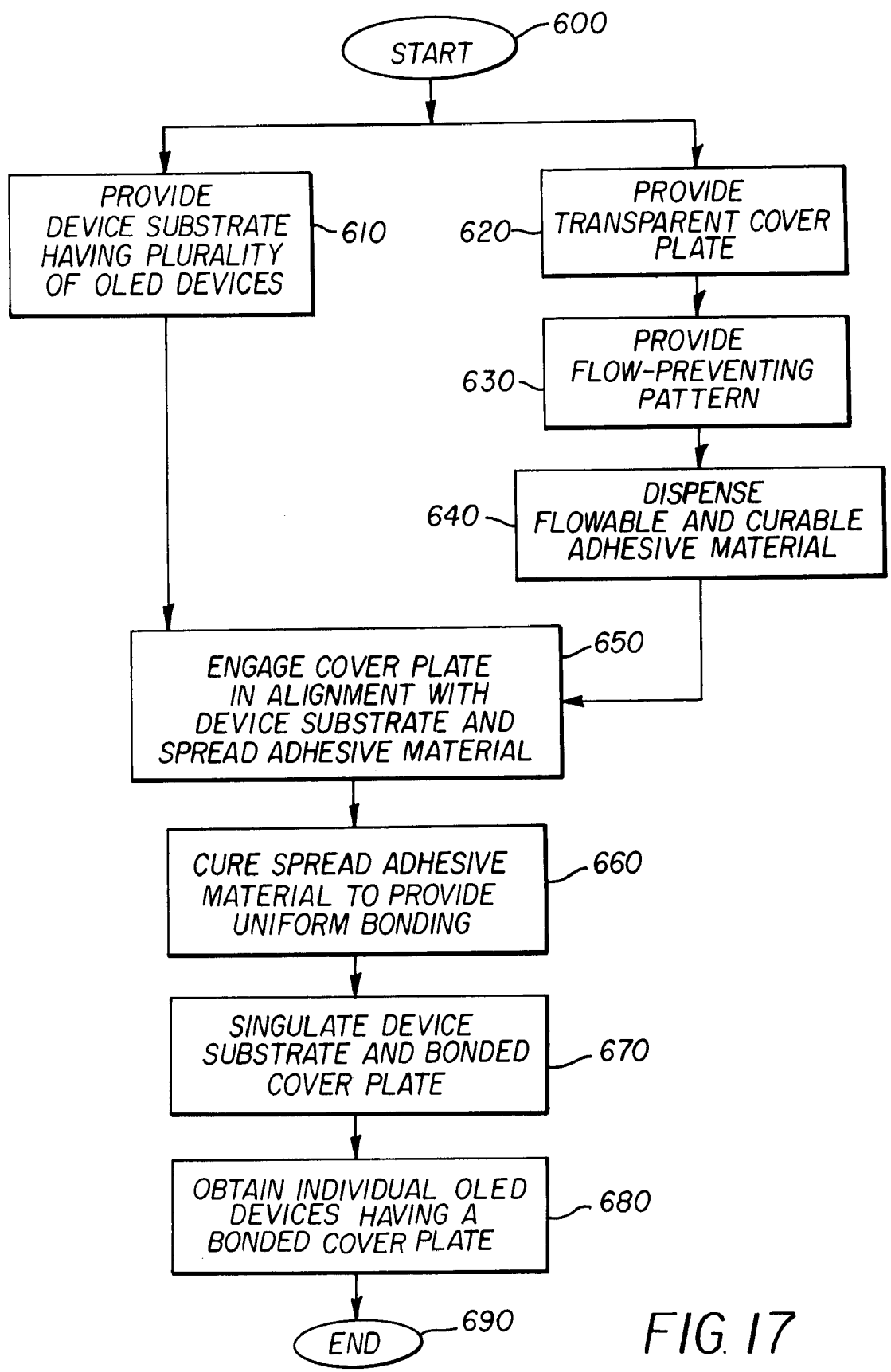
FIG. 17 is a flow chart indicating major process elements of the inventive method.

FIG. 17 is a flow chart indicating major process elements of the invention.

The process starts at 600. Element 610 includes providing a device substrate having a plurality of OLED devices formed thereon. Element 620 includes providing a transparent cover plate. Element 630 includes providing a plurality of flow-preventing patterns on a surface of the cover plate. Element 640 includes dispensing a selected amount of flowable and curable adhesive material in a spatial relationship with each flow-preventing pattern. Element 650 includes engaging the cover plate in alignment with the device substrate and spreading the flowable adhesive material. Element 660 includes curing the spread adhesive material to provide uniform bonding between selected areas of the device substrate and the cover plate. Element 670 includes singulating the device substrate and the cover plate. In element 680, individual OLED devices are obtained having a cover plate bonded by a structural buffer layer. The process ends at 690.

The invention has been described in detail with particular reference to certain preferred embodiments thereof, but it will be understood that variations and modifications can be effected within the spirit and scope of the invention.

PARTS LIST

- 100 conventionally packaged OLED device (prior art)
- 102 device substrate
- 104 anode electrode layer
- 106 cathode electrode layer
- 124 anode(s) electrical interconnect area
- 126 cathode(s) electrical interconnect area
- 130 perimeter seal
- 140 desiccant material
- 150 cover plate
- 155 spacing or a gap between upper surface of cathode electrode layer (106) and lower surface of cover plate (150)
- 250 cover plate configuration
- 250A cover plate configuration without flow-preventing pattern
- 250B cover plate configuration with a first flow-preventing dam pattern
- 250C cover plate configuration with a second flow-preventing dam pattern
- 250D cover plate configuration with a third flow-preventing dam pattern
- 250E cover plate configuration with a fourth flow-preventing dam pattern
- 250F cover plate configuration with a fifth flow-preventing dam pattern
- 250G cover plate configuration with a sixth flow-preventing dam pattern
- 250H cover plate configuration with a seventh flow-preventing dam pattern
- 250I cover plate configuration with an eighth flow-preventing groove pattern
- 250J cover plate configuration with an ninth flow-preventing groove pattern
- 205K cover plate configuration with an tenth flow-preventing groove pattern
- 252 cover plate
- 252s singulated portion of cover plate
- 253 first surface of cover plate (252)
- 257 alignment mark(s) on first cover plate surface (253)
- 259 second surface of cover plate (252)
- 267 alternative alignment mark(s) on first cover plate surface (253)
- 270 dispensed drops or dots of a flowable and curable adhesive material
- 272 dispensed lines of a flowable and curable adhesive material
- 275 unrestrained spread of drops or dots (270)
- 277 controlled spread of drops or dots (270)
- 277c cured adhesive layer, or structural buffer layer ("SBL")
- 279 overflow of excess flowable adhesive material
- 280B rectilinear flow-preventing dam pattern(s) with one opening (281)

280Bc cured flow-preventing dam pattern (280B)
280C rectilinear flow-preventing dam pattern(s) with continuous dam segments (280C1) and interrupted dam segments (280C2) providing a plurality of openings (283)
280C1 continuous dam segment(s)
280C2 interrupted dam segment(s)
280D closed rectilinear flow-preventing dam pattern(s)
280E rectilinear flow-preventing dam pattern(s) with continuous dams (280E1) and perpendicular dam segments (280E2) providing four openings (285)
280E1 continuous dam(s)
280E2 perpendicular dam segment(s)
280F interconnect area flow-preventing dam pattern(s)
280G dual-interconnect area flow-preventing darn pattern(s)
280G1 first interconnect area (328) flow-preventing darn pattern(s)
280G2 second interconnect area (329) flow-preventing dam pattern(s)
280H unidirectional flow-preventing darn pattern(s)
280I rectilinear flow-preventing groove pattern(s)
280I1 interconnect area flow-preventing groove(s)
280I2 flow-preventing groove(s)
280I3 flow-preventing groove(s)
280J unidirectional flow-preventing groove pattern(s)
280J1 interconnect area flow-preventing groove(s)
280J2 flow-preventing groove(s)
280K unidirectional flow-preventing groove pattern(s)
281 opening in flow-preventing dam pattern 280B
283 plurality of openings in flow-preventing darn pattern 280C
285 four openings in flow-preventing darn pattern 280E
300 configuration of OLED devices with one electrical interconnect area
300A alternative configuration of OLED devices
300-2 configuration of OLED devices with two electrical interconnect areas
302 device substrate
302s singulated device substrate
303 first surface of device substrate (302)
304 anode electrode layer
305 second surface of device substrate
306 cathode electrode layer
310 encapsulation layer
325 pixelated display area
325-11 pixelated OLED display area at a position (1;1)
325-13 pixelated OLED display area at a position (1;3)
325-14 pixelated OLED display area at a position (1;4)
325-21 pixelated OLED display area at a position (2;1)
325-31 pixelated OLED display area at a position (3;1)
325-xy pixelated OLED display area at a position (x;y)
328 outermost portion(s) of electrical interconnect area(s)
329 outermost portion(s) of second electrical interconnect area(s)
355 spacing between upper surface of encapsulation layer (310) and first surface (253) of cover plate (252)
357 alignment mark(s) on first surface (303) of device substrate (302)
359 aligned alignment marks (257 and 357)
360A engaged and aligned assembly configuration "A"
360B engaged and aligned assembly configuration "B"
360Bs singulated packaged OLED device (from assembly configuration 360B)
362 common edge(s) of aligned cover plate (252) and device substrate (302)
367 alternative alignment mark(s) on first surface (303) of device substrate
390 light emission from a pixel
500 power supply, scan line generator, and signal processor
502 signal lead
504 input terminal
510 output terminal
528 electrical leads
600 start of process
610 providing device substrate
620 providing transparent cover plate
630 providing flow-preventing pattern
640 dispensing flowable and curable adhesive material
650 engaging cover plate in alignment with device substrate
660 curing spread adhesive material
670 singulating device substrate and bonded cover plate
680 obtaining individual OLED devices having bonded cover plate
690 end of process
700 curing radiation
EL organic electroluminescent ("EL") medium structure
H height dimension of flow-preventing dam pattern(s)
pix light-emitting portion of a pixel
$sx1$ spacing between OLED devices along an x-direction
$sx2$ spacing between OLED devices along an x-direction, where $sx2<sx1$
$sx3$ spacing between OLED devices along an x-direction, where $sx3<sx1$
$sy1$ spacing between OLED devices along a y-direction
$sy2$ spacing between OLED devices along a y-direction where $sy2<<sy1$
x x-direction
y y-direction

What is claimed is:

1. A method of bonding a cover plate over a plurality of encapsulated top-emitting OLED devices formed on a surface of a device substrate wherein each one of the plurality of OLED devices includes a pixelated display area and at least one electrical interconnect area, comprising:
  a) providing a flow-preventing pattern by forming grooves on a surface of the cover plate or a surface of the OLED devices and at least at positions corresponding to positions of the electrical interconnect areas of the OLED devices to prevent flow of a flowable adhesive material into at least outermost portions of such interconnect areas;
  b) dispensing a selected amount of a flowable curable adhesive material on the surface of the cover plate or a surface of the OLED devices in registration with the flow-preventing pattern;
  c) engaging the cover plate in alignment with the device substrate so that the selected amount of the flowable adhesive material flows to spread to a nearest edge or to nearest edges of the flow-preventing pattern and over the pixelated display area of each one of the plurality of OLED devices and being prevented from flowing or spreading into the flow-preventing pattern so that outermost portions of the interconnect areas are free from any adhesive material;
  d) curing the spread adhesive material to provide uniform bonding between the cover plate and at least the pixelated display area of each OLED device, thereby achieving a structural buffer layer; and
  e) singulating the OLED devices and the bonded cover plate to provide individual top-emitting OLED devices having a bonded cover plate and permitting access to the at least one electrical interconnect area for attaching electrical leads thereto.

2. The method of claim 1 wherein element c) includes engaging without externally applied forces.

3. The method of claim 1 wherein element b) includes dispensing a pattern of a flowable adhesive material having a viscosity in a range from 50 to 1,000 cp.

4. The method of claim 1 wherein element d) includes directing curing radiation at the spread adhesive material through the cover plate.

5. The method of claim 1 further including forming grooves having substantially flat bottom surfaces.

6. The method of claim 1 further including forming a plurality of unidirectional grooves, or a plurality of rectilinear sets of grooves.

7. The method of claim 1 further including dispensing the adhesive material at positions approximately centered with respect to the pixelated display areas of the OLED devices.

8. A method of bonding a cover plate over a plurality of OLED devices formed on a surface of a device substrate wherein each one of the plurality of OLED devices includes a display area and at least one electrical interconnect area, comprising:
   a) providing a flow-preventing groove pattern on a surface of the cover plate to prevent flow of a flowable adhesive material into at least the outermost portions of the electrical interconnect areas;
   b) dispensing a selected amount of a flowable curable adhesive material on the surface of the cover plate in registration with the flow-preventing groove pattern;
   c) engaging the cover plate in alignment with the device substrate so that the selected amount of the flowable adhesive material spreads to the nearest edge(s) of the flow-preventing groove pattern and over the display area of each one of the plurality of OLED devices, such flowable adhesive being prevented from spreading into the flow-preventing groove pattern so that outermost portions of the interconnect areas are free from the adhesive material;
   d) curing the spread adhesive material to provide uniform bonding between the cover plate and at least the display area of each OLED device, thereby achieving a structural buffer layer; and
   e) singulating the OLED devices and the bonded cover plate to provide individual OLED devices having a bonded cover plate thereby permitting access to the at least one electrical interconnect area for attaching electrical leads thereto.

9. The method of claim 8 wherein the grooves of the flow-preventing groove pattern have sharp edges.

10. The method of claim 8 wherein the grooves of the flow-preventing groove pattern are at least 50 μm deep and at least 0.5 mm wide.

11. The method of claim 8 wherein the grooves of the flow-preventing groove pattern have surface tension characteristics that do not facilitate the wetting of the flowable adhesive material.

12. The method of claim 8 wherein the OLED devices are top-emitting and wherein the cover plate and cured adhesive are transparent.

13. An OLED device comprising:
   a) a substrate;
   b) a display area including at least one anode and at least one cathode formed over the substrate, and an organic electroluminescent medium structure provided between the anode and cathode;
   c) an electrical interconnect area;
   d) a cover plate provided over and bonded to the display area by a cured adhesive material, such adhesive material having been flowable prior to curing, and
   e) the cover plate includes a flow-preventing groove pattern on the surface facing the substrate such that the adhesive material is in contact with the display area and the cover plate up to the edge of the grooves of the groove pattern, the grooves of such groove pattern not being in contact with the adhesive material, and wherein the flow-preventing groove pattern is provided in registration with the electrical interconnect areas such that the outermost portions of the electrical interconnect areas are free from the adhesive material.

14. A method of bonding a cover plate over a plurality of OLED devices formed on a surface of a device substrate wherein each one of the plurality of OLED devices includes a display area and at least one electrical interconnect area, comprising:
   a) providing a flow-preventing pattern by forming grooves on a surface of the cover plate or a surface of the OLED devices such pattern having a closed, rectilinear shape to surround at least the outermost portions of the interconnect areas;
   b) dispensing a selected amount of flowable curable adhesive material on the surface of the cover plate or a surface of the OLED devices in a position outside of the closed, rectilinear flow-preventing pattern;
   c) engaging the cover plate in alignment with the device substrate so that the selected amount of the flowable adhesive material flows spreads to the nearest edge(s) of the flow-preventing pattern and over the display area of each one of the plurality of OLED devices and being prevented from spreading into the flow-preventing pattern so that outermost portions of the interconnect areas are free from any adhesive material;
   d) curing the spread adhesive material to provide uniform bonding between the cover plate and at least the display area of each OLED device, thereby achieving a structural buffer layer; and
   e) singulating the OLED devices and the bonded cover plate to provide individual OLED devices having a bonded cover plate thereby permitting access to the at least one electrical interconnect area for attaching electrical leads thereto.

15. A method of bonding a cover plate over a plurality of OLED devices formed on a surface of a device substrate wherein each one of the plurality of OLED devices includes a display area and at least one electrical interconnect area, comprising:
   a) providing a flow-preventing pattern by forming grooves on a surface of the cover plate or a surface of the OLED devices, a portion of the pattern being provided at a position corresponding to positions of the electrical interconnect areas of the OLED devices, such pattern defining at least one opening in a position spaced from the electrical interconnect areas;
   b) dispensing a selected amount of flowable curable adhesive material on the surface of the cover plate or a surface of the OLED devices in registration with the flow-preventing pattern;
   c) engaging the cover plate in alignment with the device substrate so that the selected amount of the flowable adhesive material spreads to nearest edge(s) of the flow-preventing pattern and over the display area of each one of the plurality of OLED devices and being prevented from spreading into the flow-preventing pattern so that outermost portions of the interconnect areas are free from the adhesive material;

d) curing the spread adhesive material to provide uniform bonding between the cover plate and at least the display area of each OLED device, thereby achieving a structural buffer layer; and e) singulating the OLED devices and the bonded cover plate to provide individual OLED devices having a bonded cover plate thereby permitting access to the at least one electrical interconnect area for attaching electrical leads thereto.

16. The method of claim 15 further including forming a plurality of unidirectional grooves, a plurality of partially open rectilinear grooves or a plurality of rectilinear sets of grooves.

* * * * *